United States Patent
Cok

(10) Patent No.: US 9,867,289 B2
(45) Date of Patent: *Jan. 9, 2018

(54) FILLED LARGE-FORMAT IMPRINTING METHOD

(71) Applicant: Eastman Kodak Company, Rochester, NY (US)

(72) Inventor: Ronald Steven Cok, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 486 days.

This patent is subject to a terminal disclaimer.

(21) Appl. No.: 14/475,869

(22) Filed: Sep. 3, 2014

(65) Prior Publication Data

US 2016/0062004 A1  Mar. 3, 2016

(51) Int. Cl.

| B29C 33/42 | (2006.01) |
|---|---|
| H05K 1/09 | (2006.01) |
| G02B 5/20 | (2006.01) |
| G02B 5/00 | (2006.01) |
| B29C 35/08 | (2006.01) |
| B29C 59/00 | (2006.01) |

(Continued)

(52) U.S. Cl.
CPC ......... *H05K 1/092* (2013.01); *B29C 35/0805* (2013.01); *B29C 59/002* (2013.01); *B29C 59/022* (2013.01); *B29C 59/026* (2013.01); *G02B 5/003* (2013.01); *G02B 5/201* (2013.01); *G02F 1/133514* (2013.01); *G02F 1/133516* (2013.01); *G03F 7/0002* (2013.01); *G03F 7/0007* (2013.01); *H05K 1/111* (2013.01); *B29C 2035/0827* (2013.01); *B29C 2059/023* (2013.01); *B29K 2105/24* (2013.01); *B29K 2995/0021* (2013.01); *B29L 2031/3475* (2013.01); *G02F 2001/133519* (2013.01); *G02F 2201/52* (2013.01); *H05K 2201/0108* (2013.01)

(58) Field of Classification Search
CPC .................. G03F 7/0007; G02F 1/133516
See application file for complete search history.

(56) References Cited

U.S. PATENT DOCUMENTS

| 6,497,981 B2 | 12/2002 | Chen et al. | |
|---|---|---|---|
| 9,161,456 B1 * | 10/2015 | Cok | ..................... H05K 3/1258 |

(Continued)

FOREIGN PATENT DOCUMENTS

EP    365219    12/1994

*Primary Examiner* — Galen Hauth
(74) *Attorney, Agent, or Firm* — Raymond L. Owens; Kevin E. Spaulding

(57) ABSTRACT

A method of making a filled large-format imprinted structure includes providing a substrate, locating a curable layer over the substrate, imprinting the curable layer, and curing the curable layer to form a cured layer including a layer surface having one or more areas. Each area has a plurality of imprinted micro-cavities, wherein each micro-cavity has a micro-cavity width less than or equal to 20 microns. A rib separates each micro-cavity from an adjacent micro-cavity by a rib width that is less than the micro-cavity width, the rib extending from a bottom of the micro-cavity to the layer surface. A common curable material is located in each micro-cavity and cured to form common cured material in each micro-cavity, thereby defining a filled large-format imprinted structure.

19 Claims, 11 Drawing Sheets

(51) Int. Cl.
*B29C 59/02* (2006.01)
*G02F 1/1335* (2006.01)
*H05K 1/11* (2006.01)
*G03F 7/00* (2006.01)
*B29K 105/24* (2006.01)
*B29L 31/34* (2006.01)

(56) References Cited

U.S. PATENT DOCUMENTS

| | | | |
|---|---|---|---|
| 2002/0126249 A1* | 9/2002 | Liang | C09K 19/544 349/187 |
| 2011/0085116 A1* | 4/2011 | Kim | G02B 5/32 349/106 |
| 2013/0038958 A1 | 2/2013 | Lin et al. | |

* cited by examiner

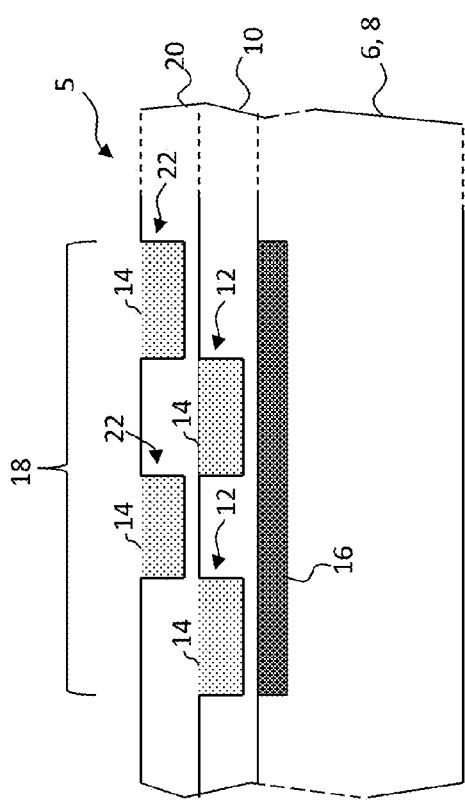
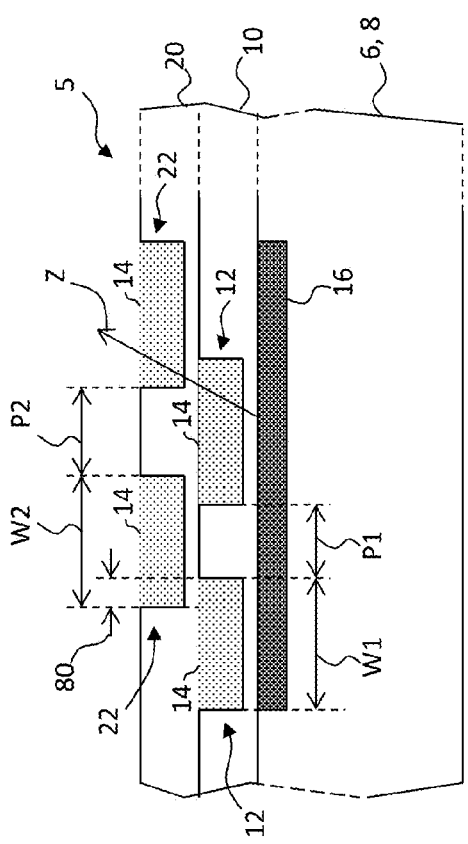
FIG. 6A
FIG. 6B

FILLED LARGE-FORMAT IMPRINTING METHOD

CROSS REFERENCE TO RELATED APPLICATIONS

Reference is made to commonly-assigned U.S. patent application Ser. No. 14/475,854 (now U.S. Publication No. 2016/0062003), filed Sep. 3, 2014, entitled Filled Large-Format Imprinted Structure by Cok; to commonly-assigned U.S. patent application Ser. No. 14/475,878 (now U.S. Publication No. 2016/0062176), filed Sep. 3, 2014, entitled Ribbed Large-Format Imprinted Structure by Cok; to commonly-assigned U.S. patent application Ser. No. 14/475,896 (now U.S. Publication No. 2016/0062005), filed Sep. 3, 2014entitled Ribbed Large-Format Imprinting Method by Cok; to commonly-assigned U.S. patent application Ser. No. 14/475,917 (now U.S. Publication No. 2016/0062006), filed Sep. 3, 2014, entitled Multi-Layer Large-Format Imprinted Structure by Cok; to commonly-assigned U.S. patent application Ser. No. 14/475,934 (now U.S. Publication No. 2016/0062181), filed Sep. 3, 2014entitled Multi-Layer Large-Format Imprinting Method by Cok; to commonly-assigned U.S. patent application Ser. No. 14/475,955 (now U.S. Pat. No. 9,545,000), filed Sep. 3, 2014entitled Stacked Large-Format Imprinted Structure by Cok; to commonly-assigned U.S. patent application Ser. No. 14/475,974 (now U.S. Publication No. 2016/0062008), entitled Stacked Large-Format Imprinting Method by Cok; to commonly-assigned U.S. patent application Ser. No. 13/784,866 (now U.S. Publication No. 2014/0251660), filed Mar. 5, 2013 filed entitled Variable Depth Micro-Channel Structure by Cok; and to commonly-assigned U.S. patent application Ser. No. 13/784,869 (now U.S. Publication No. 2014/0251661), filed Mar. 5, 2013 filed concurrently herewith, entitled Micro-Channel Structure with Variable Depths by Cok; the disclosures of which are incorporated herein.

FIELD OF THE INVENTION

The present invention relates to multi-layer imprinted structures having micro-cavities filled with cured materials.

BACKGROUND OF THE INVENTION

Color filter arrays are widely used with liquid crystal displays (LCDs) to provide color pixels. In such displays, each pixel is arranged to emit or reflect light through a color filter. The pixels are typically substantially rectangular with sides having lengths ranging from tens of microns to hundreds of microns, depending on the display size and resolution. For example, a pixel and corresponding color filter can have a size of 100 microns by 200 microns and a thickness of approximately a micron to tens of microns. A typical display can have a fill factor (the percentage of the display area covered by pixels and color filters) of 50% or even more.

The color filters are typically made using photolithographic processes in which surfaces are coated with a material (for example by evaporation, thermal transfer, or by a liquid coating containing dyes or pigments). The coated layer is then cured, if necessary, and photolithographically patterned, for example by coating a photoresist, exposing the resist to light such as ultra-violet (UV) light through a mask to develop a pattern in the resist corresponding to the mask, and etching the patterned resist and the underlying coated layer to form a color filter pattern corresponding to the mask. This process is expensive and time consuming because it is a subtractive process that is wasteful of etched materials, uses additional, expensive materials such as photoresists and masks, and requires expensive optical alignment equipment.

U.S. Pat. No. 6,497,981 describes a method of forming a color filter array. A substrate having a passivation layer thereon is provided. A negative color photoresist layer is formed over the passivation layer. A photolithographic exposure process is conducted using a light source with a wavelength less than or equal to 248 nm so that a pattern for forming a color filter array is imprinted on the negative color photoresist layer. In an alternative method, U.S. Patent Application Publication No. 20130038958 discloses a manufacturing method of a color filter array including providing a substrate; forming a light shielding layer on the substrate, the light shielding layer having a plurality of openings, the openings exposing a surface of the substrate, the light shielding layer having a height H; performing an inkjet printing process to inject color filter ink into the openings of the light shielding layer; and performing a solidifying process to solidify the color filter ink to form a plurality of color filter patterns. In yet another approach, EP0365219 teaches a method of making an array of a repeating mosaic pattern of colorants carried on a support using (a) a plurality of donor materials each comprising respectively a sublimable dye of a different color, and (b) a receiver element comprising a support having thereon a dye-receiving layer, wherein each donor material is in turn brought into face-to-face contact with the receiver and heated patternwise by contact with a heated embossed surface to transfer the desired pattern of dye to the dye-receiving layer.

It is also known to form small-scale features in thin layers of curable materials such as cross-linkable polymers using an embossing or imprinting process. In such processes, a curable layer is coated over a substrate, the curable layer is imprinted with a stamp having desired relief features that project from the stamp surface into the curable layer, the curable layer is cured using heat or radiation depending on the attributes of the cross-linkable polymer, and the stamp is removed. Such processes can be fast, cover large areas, and are applicable to inexpensive roll-to-roll manufacturing processes. However, the area that is imprinted with a relief pattern is typically much smaller than the area that is not imprinted, since the imprinting process displaces material that must flow to another location in the imprinted layer. Thus, the imprinted area is relatively small compared to the total area of the cured material and the size of the features in the relief pattern is likewise relatively small, for example less than 20 microns in width. Thus, imprinted structures over a substrate typically have a small fill factor.

Methods for filling imprinted features in a layer are known, for example coating curable material over an imprinted substrate with relief features, removing excess curable material from the surface of the imprinted substrate but not the imprinted relief features, and curing the curable material in the relief features. However, as with the imprinting process itself, it is difficult to uniformly fill a large, imprinted area with a liquid that is subsequently cured. For example, the coffee-ring effect is widely known to compromise the uniformity of a dried coating because of capillary flow induced by differential evaporation rates over the extent of the coating.

Therefore, because of such imprinting and drying problems, it is difficult to form large fill-factor substrates, such as color filter substrates, using imprint-and-fill processes.

SUMMARY OF THE INVENTION

There is a need, therefore, for improved methods and materials for forming filled large-format imprinted structures including color filters with a large fill factor that provide improved uniformity and size, increases manufacturing speed, and requires less material and equipment.

In accordance with the present invention, a method of making a filled large-format imprinted structure comprises:
providing a substrate;
locating a curable layer over the substrate, imprinting the curable layer, and curing the curable layer to form a cured layer including a layer surface having one or more areas, each area having a plurality of imprinted micro-cavities, wherein each micro-cavity has a micro-cavity width less than or equal to 20 microns and a rib separating each micro-cavity from an adjacent micro-cavity by a rib width that is less than the micro-cavity width, the rib extending from a bottom of the micro-cavity to the layer surface; and
locating a common curable material in each micro-cavity and curing the curable material to form common cured material in each micro-cavity, thereby defining a filled large-format imprinted structure.

Structures and methods of the present invention provide color filters on a large fill-factor substrate and, more generally, provide filled large-format imprinted structures having improved uniformity and size using a process that decreases material requirement, increases manufacturing speed, and requires less material and equipment.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein:

FIGS. 6A and 6B are enlarged cross-sectional views of a portion of a multi-layer filled large-format imprinted structure with multiple multi-layer micro-cavities per display pixel in an embodiment of the present invention;

Figure 1:
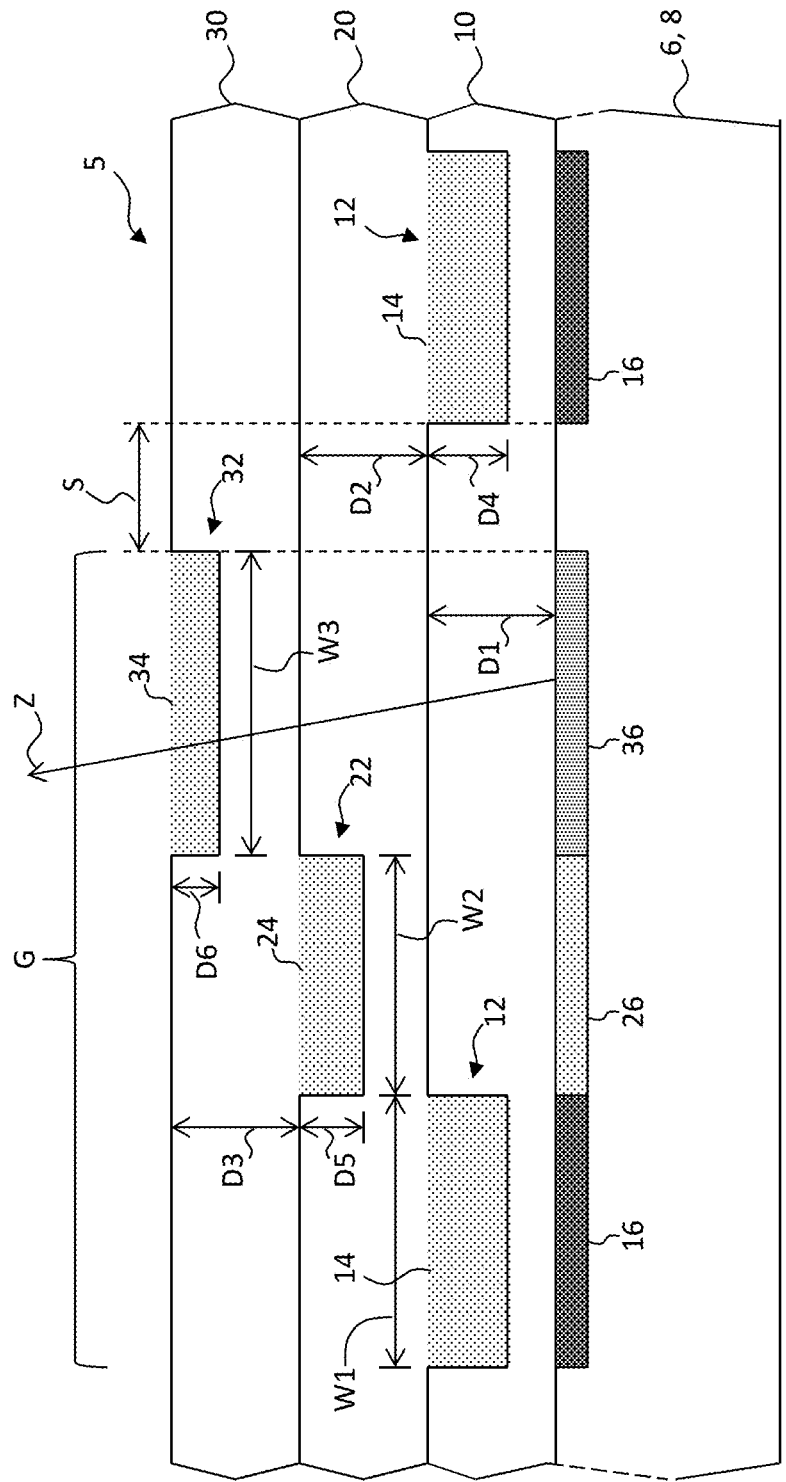
FIG. 1 is a cross-sectional view of a multi-layer filled large-format imprinted structure in an embodiment of the present invention.

The Figures are not necessarily to scale, since the range of dimensions in the drawings is too great to permit depiction to scale.

DETAILED DESCRIPTION OF THE INVENTION

According to various embodiments and methods of the present invention, filled large-format imprinted structures such as color filters having improved uniformity and size are provided by using structures and processes that decrease material requirements, increase manufacturing speed, and require less equipment. As is described more fully below, imprinting processes form relief features or structures such as micro-cavities in a curable layer. Once the curable layer is cured, the micro-cavities are filled with a curable material and dried to form, for example, color filters. Multiple stacked cured layers, arrangements of micro-cavities in the stacked cured layers, and structures formed in the micro-cavities in the cured layers mitigate problems found in structures and methods of the prior art.

Additive imprinting processes are known to form small features such as micro-cavities in cured layers at a relatively high rate compatible with inexpensive roll-to-roll processes with less waste than other processes such as photo-lithographic processes. Multiple cured layers reduce the relative quantity of imprinted material in a given layer and structures within the imprinted micro-cavities improve the distribution of curable material, such as color filter material, within the micro-cavities.

Figure 10:
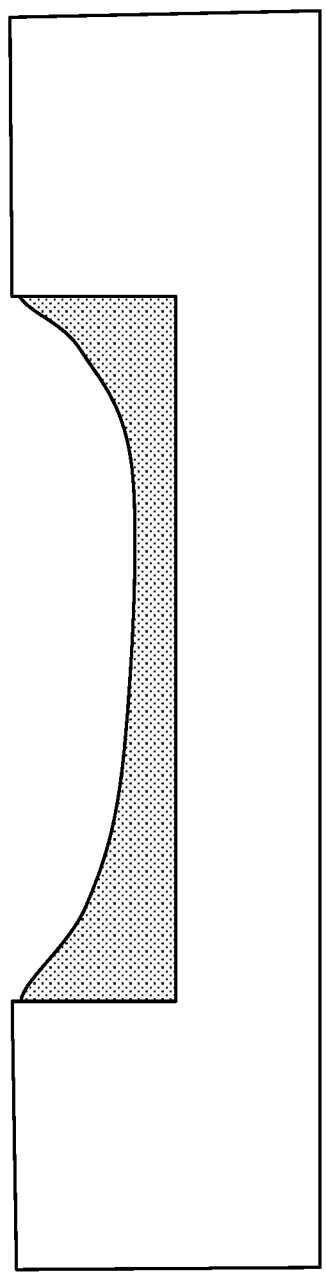
FIG. 10 is a representation illustrating a wide micro-cavity useful in understanding the present invention.

Referring to FIG. 10, it has been discovered through experimentation that materials dried within a large area, for example a wide micro-cavity having a width greater than 20 microns does not dry evenly within the micro-cavity. Furthermore, when a liquid material coated over the surface and micro-cavities of the cured layer is removed from the surface of the cured layer, for example by wiping, to leave the liquid material only in the micro-cavities, if the micro-cavity is too wide the liquid material is also removed from the micro-cavity by the wiping device. Even repeated coatings of the liquid material will not solve this wiping problem, since the coated liquid material is repeatedly wiped from the wide micro-cavities.

As is readily observed in FIG. 10, the dried material is thinner in the center than at the edges of the micro-cavity. If the dried material is a color filter that is uniformly illuminated, the result would be a non-uniform color transmitted through and across the color filter, since a thinner color filter does not saturate light as a thicker color filter does, thereby providing a display with less saturated colors and pixels that are not uniform.

According to embodiments of the present invention, a filled large-format structure 5 includes a layer of cured material having imprinted micro-cavities that are filled with a cured material, for example forming color filters. Referring to FIG. 1, the filled large-format imprinted structure 5 includes a substrate 8 and a first cured layer 10 located over the substrate 8. First micro-cavities 12 are imprinted in the first cured layer 10 and a first cured material 14 of a first color is located in the first micro-cavities 12. A second cured layer 20 is located over the first cured layer 10, the first micro-cavities 12, and the first cured material 14. Second micro-cavities 22 are imprinted in the second cured layer 20 and a second cured material 24 of a second color is located in the second micro-cavities 22. A third cured layer 30 is located over the second cured layer 20, the second micro-cavities 22, and the second cured material 24. Third micro-cavities 32 are imprinted in the third cured layer 30 and a third cured material 34 of a third color is located in the third micro-cavities 32. The first, second, and third colors can all be different colors, for example red, green, or blue, corresponding to the primary colors of a display.

In an embodiment, the substrate 8 is a transparent substrate and the first, second, and third cured layers 10, 20, 30 are transparent layers. In another embodiment, the substrate 8 is a component of a display 6 such as an LCD or OLED display, for example the cover or substrate of the display 6 through which light from an array of pixels is emitted, reflected, or transmitted. The display 6 includes an array of pixels such as a first pixel 16, a second pixel 26, and a third pixel 36, each of which independently controls emitted, transmitted, or reflected light and corresponds, for example, to colored pixels such as red, green, and blue pixels. As is well known in the art, some LCD and OLED displays use a white-light backlight whose light is patterned according to pixels controlled by a display controller (not shown) and colored by color filters. The display 6 in the present invention can emit white light that is colored by color filters provided by the large-format imprinted structures 5 of the present invention. The large-format imprinted structures 5 are filled with dyes or pigments to color light from the display pixels transmitted through the filled large-format imprinted structures 5. According to the present invention, the large-format imprinted structures 5 filled with dyes or pigments are referred to as color filters, but the present invention is not limited to color filter applications only.

According to another embodiment of the present invention, the large-format imprinted structure 5 further includes the display 6 having at least the first, second, and third pixels 16, 26, 36 located beneath the first cured layer 10, the first pixel 16 located at least partially beneath the first micro-cavity 12, the second pixel 26 located at least partially beneath the second micro-cavity 22, and the third pixel 36 located at least partially beneath the third micro-cavity 32.

As used herein, the first, second, and third micro-cavities 12, 22, 32 are structures imprinted in the first, second, and third cured layers 10, 20, 30, respectively, and can also be referred to as micro-channels or micro-structures. The term micro-cavity is used in other arts to refer to an optical cavity with reflective surfaces that cause constructive optical interference at particular optical frequencies corresponding to the depth of the micro-cavity. However, in the present invention, reflective surfaces are not necessarily present in the micro-cavities and the term micro-cavity simply refers to a small imprinted cavity, opening, indentation, or channel in a cured layer and does not imply any optical interference or constructive resonant effects. The micro-cavities can have any useful shape, regular or irregular, for example rectangular, polygonal, or with curved edges. The micro-cavities can be immediately adjacent in a layer or layers, for example having a common edge in a direction orthogonal to a surface of the substrate 8. The micro-cavities can form long, thin structures that are termed micro-channels. Alternatively, each micro-cavity is separated from other micro-cavities by a gap in one or two dimensions.

Figure 2:
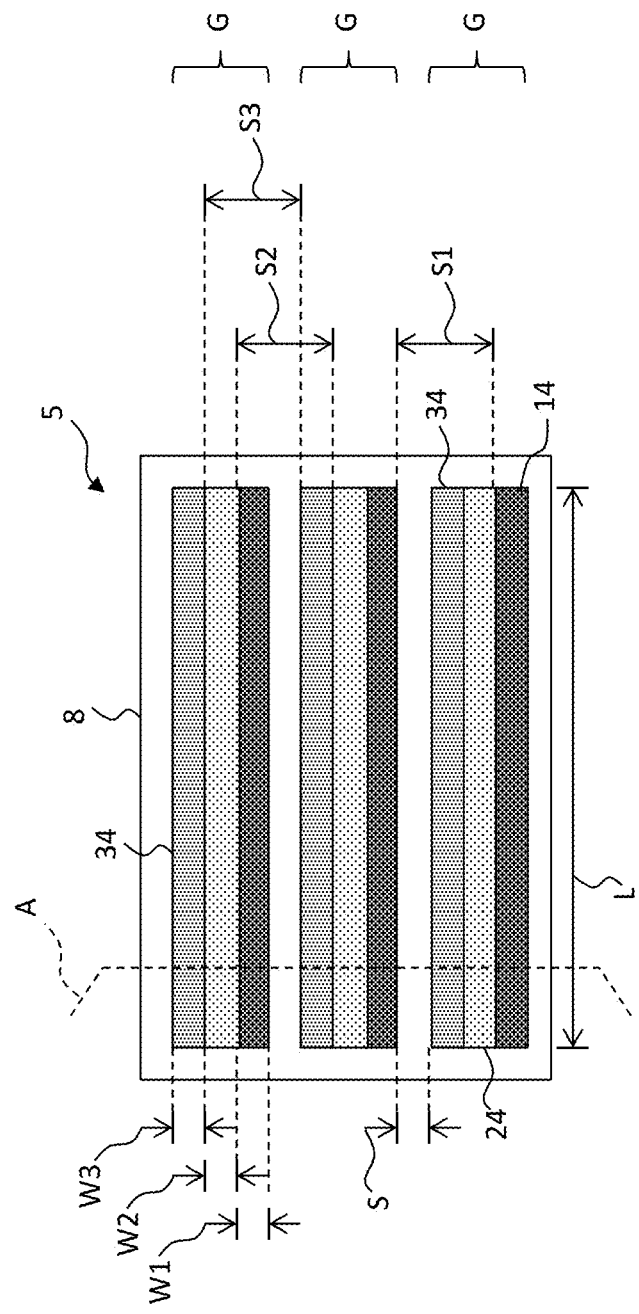
FIG. 2 is a plan view of the multi-layer filled large-format imprinted structure of FIG. 1 in an embodiment of the present invention.

Referring to the plan view of FIG. 2, the first, second, and third micro-cavities 12, 22, 32 form an array of micro-channels that extend a length L across the substrate 8. Each micro-channel can correspond to a row (or column) of display pixels and the first cured material 14, the second cured material 24, and the third cured material 34 form color filters in the micro-channels associated with the rows (or columns) of display pixels. The cross section of FIG. 1 is taken along the cross section line A of FIG. 2. Although it is the cured materials that filter light, the cured materials are located in the micro-cavities and it is understood that the micro-cavities with cured materials located therein filter light and are also referred to as color filters. Therefore, references to a micro-cavity can also refer to the corresponding cured material located in the micro-cavity and vice versa.

Referring to both FIGS. 1 and 2, an embodiment of the filled large-format imprinted structure 5 of the present invention includes the first, second, and third micro-cavities 12, 22, 32 having widths of W1, W2, and W3 formed in the first, second, and third cured layers 10, 20, 30 having depths of D1, D2, and D3, respectively. The first micro-cavities 12 and the corresponding cured materials 14 located in the first cured layer 10 are separated by a first gap S1 and have a depth D4. The second micro-cavities 22 and the corresponding second cured materials 24 located in the second cured layer 20 are separated by a second gap S2 and have a depth D5. The third micro-cavities 32 and the corresponding cured materials 34 located in the third cured layer 30 are separated by a third gap S3 and have a depth D6.

As shown in FIG. 1, the first cured material 14 in the first cured layer 10 is aligned with the first pixel 16, the second cured material 24 in the second cured layer 20 is aligned with the second pixel 26, and the third cured material 34 in the third cured layer 30 is aligned with the third pixel 36. In this illustration, there is no separation gap between the first, second, and third pixels 16, 26, 36 or the first, second, and third cured materials 14, 24, 34 within the group G. Thus, an embodiment of the present invention includes the first micro-cavity 12 adjacent to the second micro-cavity 22 adjacent to the third micro-cavity 32 forming the first group G, a different first micro-cavity 12 adjacent to a different second micro-cavity 22 adjacent to a different third micro-cavity 32 forming a second group G in a direction parallel to a surface of the substrate 8.

In an embodiment, the groups G correspond to full-color pixels and each individual first, second, or third pixel 16, 26, 36 is a single-color pixel or sub-pixel. Thus, the first pixel 16 and corresponding first cured material 14 aligned with the second pixel 26 and corresponding second cured material 24, and the third pixel 36 and corresponding third cured material 34 forms a full-color pixel and is separated from a neighboring full-color pixel by the separation gap S, at least in a direction orthogonal to the extent of the imprinted micro-channels and parallel to a surface of the substrate 8. Such an arrangement can enable efficient filling of the micro-cavities with liquid curable materials. Although the illustration of FIG. 2 shows imprinted micro-channels extending a length L across the substrate 8, in other embodiments, imprinted elements forming micro-cavities are separately formed in an array so that no pixel or micro-cavity is in contact with a neighboring pixel or micro-cavity and each micro-cavity is separated from each other micro-cavity.

As shown, the first micro-cavity 12 has a first depth D4 that is less than the first cured layer 10 thickness D1, the second micro-cavity 22 has a depth D5 that is less than the second cured layer 20 depth D2, or the third micro-cavity 32 has a depth D6 that is less than the third cured layer 30 thickness D3. The depth is taken in a direction orthogonal to a surface of the substrate 8. For clarity, as used herein the thickness of a layer or material is also referred to as the depth of the layer or material and refers to the thickness of the layer or material in a direction perpendicular to a surface of the substrate 8. Generally, micro-cavities are referred to as having a depth and layers and materials are referred to as having a thickness. By ensuring that the thickness of a layer is greater than the depth of a micro-cavity imprinted in the layer, the amount of material that is displaced by imprinting relative to the total amount of material in the layer is reduced. At the same time, it is useful to employ relatively thin layers, for example less than 20 microns, less than 10 microns, less than five microns, less than two microns, or even less than one micron to reduce the total amount of material in the imprinted cured layers. However, those skilled in the art will appreciate that the depth of the micro-cavities will depend, at least in part, by the desired thickness of the first, second, and third cured materials, 14, 24, 34 necessary to filter the light from the first, second, and third pixels 16, 26, 36 to a desired color saturation. This thickness will depend on the nature of the cured materials (e.g. dye or pigment load and material type) and the spectrum of light from the corresponding pixel.

In other embodiments, the first cured layer 10 has a thickness D1 that is different from the thickness D2 of the second cured layer 20, the first cured layer 10 has a thickness D1 that is different from the thickness D3 of the third cured layer 30, or the second cured layer 20 has a thickness D2 that is different from the thickness D3 of the third cured layer 30. Correspondingly, the first micro-cavity 12 has a depth D4 that is different from the depth D5 of the second micro-cavity 22, the first micro-cavity 12 has a depth D4 that is different from the depth D6 of the third micro-cavity 32, or the second micro-cavity 22 has a depth D5 that is different from the depth D6 of the third micro-cavity 32. Similarly, the first cured material 14 has a thickness D4 that is different from the thickness D5 of the second cured material 24, the first cured material 14 has a thickness D4 that is different from the thickness D6 of the third cured material 34, or the second cured material 24 has a thickness D5 that is different from the thickness D6 of the third cured material 34. Since different color filters require different materials providing different amounts of saturated light from a white-light source with a variable-intensity spectrum, it is useful to employ different thicknesses of materials in differently colored filters.

In another useful embodiment illustrated in FIG. 1, the first micro-cavity 12 has a spatial area that is different from the spatial area of the second micro-cavity 22, the first micro-cavity 12 has a spatial area that is different from the spatial area of the third micro-cavity 32, or the second micro-cavity 22 has a spatial area that is different from the spatial area of the third micro-cavity 32. In this way, each pixel or corresponding color filter can have a different area. As shown in FIG. 1 (but not in the lower resolution plan view of FIG. 2), the width W1 of the first micro-cavity 12 is greater than the width W2 of the second micro-cavity 22 and less than the width W3 of the third micro-cavity 32. The area of a micro-cavity is directly related to the width of the micro-cavity. A micro-cavity can have a different size than another micro-cavity in any spatial dimension, including width, length, or, as noted above, depth. Such differently sized arrangements are useful, for example to provide different amounts of colored light from each pixel, and are used to improve a display with respect to the response of the human visual system.

Figure 3:
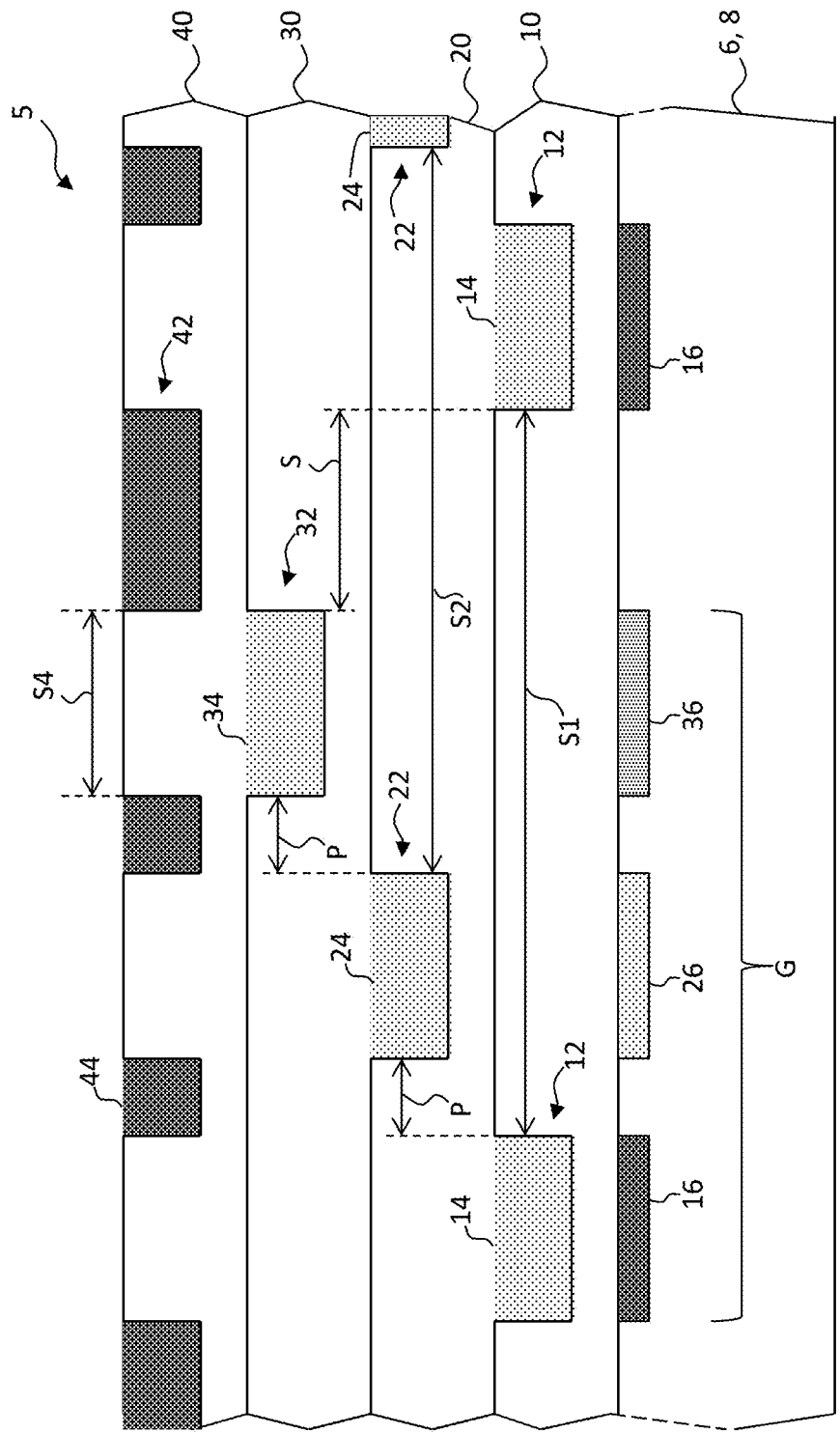
FIG. 3 is a cross-sectional view of a multi-layer filled large-format imprinted structure with separated micro-cavities in an embodiment of the present invention.

As noted above and illustrated in FIGS. 1 and 2, the first, second, and third cured materials 14, 24, and 34 are aligned in groups G and a separation gap S separates the groups G. First, second, and third cured materials 14, 24, 34 within a group G are located in separate layers but are aligned with edges in a common line in a plan view of the substrate 8. In an alternative embodiment, as illustrated in FIG. 3, the first, second and third cured materials 14, 24, 34 in different cured layers 10, 20, 30 are separated by the gap S in a direction parallel to a surface of the substrate 8. Referring to FIG. 3, according to an embodiment of present invention, the filled large-format imprinted structure 5 forming color filters includes the substrate 8 and the first cured layer 10 located over the substrate 8. First micro-cavities 12 are imprinted in the first cured layer 10 and the first cured material 14 of a first color is located in the first micro-cavities 12. The second cured layer 20 is located over the first cured layer 10, first micro-cavities 12, and first cured material 14. Second micro-cavities 22 are imprinted in the second cured layer 20 and a second cured material 24 of a second color is located in the second micro-cavities 22. The third cured layer 30 is located over the second cured layer 20, second micro-cavities 22, and second cured material 24. Third micro-cavities 32 are imprinted in the third cured layer 30 and the third cured material 34 of a third color is located in the third micro-cavities 32. The first, second, and third colors can all be different colors, for example red, green, and blue, corresponding to the primary colors of a display.

As shown in FIG. 3 (and FIG. 2), the first micro-cavities 12 are spaced apart by first gaps S1, the second micro-cavities 22 are spaced apart by second gaps S2, and the third micro-cavities 32 are spaced apart by third gaps S3 (FIG. 2) in a direction parallel to a substrate surface. In one embodiment, the first, second, and third gaps S1, S2, S3 are the same (as shown); in another embodiment the first, second, and third gaps S1, S2, S3 are different. As shown in FIG. 3, the first, second, and third micro-cavities 12, 22, 32 and the first, second, and third cured materials 14, 24, 34 in a group G are separated by a gap P in a direction parallel to a surface of the substrate 8. The groups G of first, second, and third cured materials 14 are separated by the gap S. The gaps P are useful for routing control and power signals to the display pixels. In a useful embodiment, S is larger than P so that groups G of full-color pixels are separated by a gap S greater than the separation gap P separating single-color pixels within a group forming a full-color pixel. This assists the human visual system to blend the separate, differently colored first, second, and third pixels 16, 26, 36 into one full-color pixel (corresponding to a group G) while providing room to route power and control signals in the display.

The arrangement of FIG. 3 leaves gaps P between the pixels that could decrease the perceived saturation of pixels since white light from a display backlight can travel between the first, second, and third cured materials 14, 24, 34 without traveling through them. In an embodiment, this is mitigated by providing another, fourth cured layer 40 with fourth micro-cavities 42 having cured material 44 located at least partly above the first gaps S1 between first micro-cavities 12, the second gaps S2 between the second micro-cavities 22, the third gaps S3 between the third micro-cavities, above the gaps P between the first and second micro-cavities 12, 22, above the gaps P between the second and third micro-cavities 22, 32, or above the gaps P between the first and third micro-cavities 12, 32. In an embodiment, the fourth cured material 44 is black (for example including carbon black), so that the fourth cured layer 40 serves as a black matrix for the display 6.

Although the fourth cured layer 40 is shown on a side of the first, second, and third cured layers 10, 20, 30 opposite the display 6, it can be located between any of the first, second, or third layers 10, 20, 30 or, in a useful embodiment, between the first, second, and third layers 10, 20, 30 and the display 6 (not shown). Likewise, the order of the first, second, or third layers 10, 20, 30 relative to the substrate 8 are interchangeable. Thus, the words above or below are relative and can be interchanged depending on the relative orientation and location of the substrate 8, the first layer 10, the second layer 20, the third layer 30, and the fourth layer 40. Moreover, when a micro-cavity or cured material is located above or below a pixel or other micro-cavity, a line directed orthogonally to a surface of the substrate 8 passes through the micro-cavity or cured material and the pixel or other micro-cavity. Thus, light emitted or reflected by the pixel orthogonally to the substrate will pass through the micro-cavity or cured material. Similarly, when a layer is located above or below another layer, a line directed orthogonally to a surface of the substrate 8 passes through the two layers.

In the arrangement of FIG. 3, the first micro-cavities 12 are located beneath the second gaps S2 or the third gaps S3, or both. Likewise, the second micro-cavities 22 are located above the first gaps S1 or beneath the third gaps S3, or both. Similarly, the third micro-cavities 32 are located above the first gaps S1 or above the second gaps S2. In a useful embodiment, the fourth micro-cavities 42 are located above or below the gaps P between the first, second, or third micro-cavities 12, 22, 32 in a group G, or above or below the gaps S between the groups G of the first, second, or third micro-cavities 12, 22, 32. Such an arrangement permits the fourth cured material 44 to absorb light emitted from a display that does not pass through any of the first, second, or third cured materials 14, 24, 34.

Figure 4:
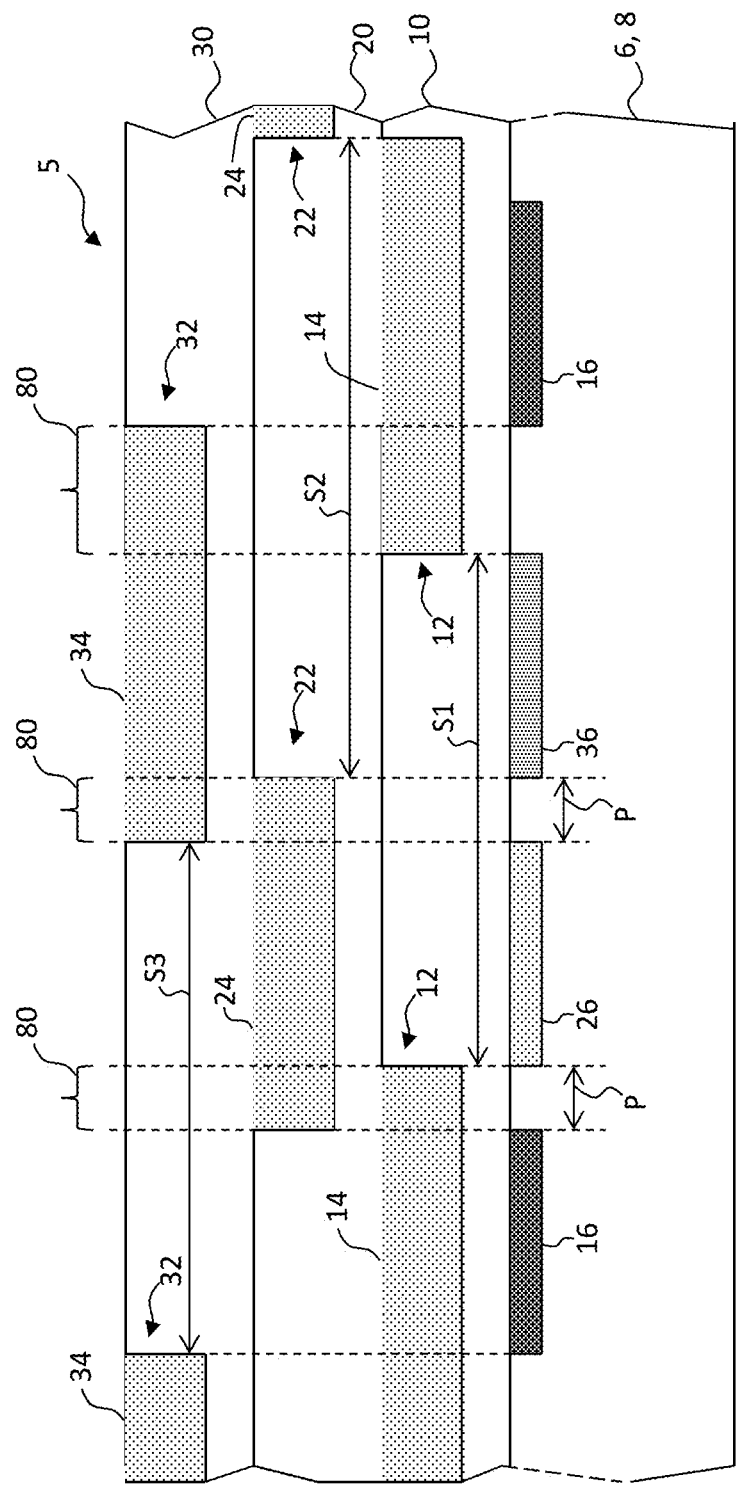
FIG. 4 is a cross-sectional view of an another multi-layer filled large-format imprinted structure with overlapping micro-cavities in an embodiment of the present invention.

Referring to FIG. 4 in another embodiment of the present invention, the first, second, or third cured materials 14, 24, 34 overlap in a direction orthogonal to a surface of the substrate 8 to provide light absorption. As shown in FIG. 4, the first micro-cavities 12 are located at least partially beneath the second micro-cavities 24 and at least partially beneath the second gaps S2 or are located at least partially beneath the third micro-cavities 32 and at least partially beneath the third gaps S3 to form an overlap 80. Likewise, the second micro-cavities 22 are located at least partially beneath the third micro-cavities 32 and at least partially beneath the third gaps S3 to form the overlap 80 and the third micro-cavities 32 are located at least partially above the first micro-cavities 12 and at least partially above the first gaps S1 to form the overlap 80. In a further embodiment of the present invention, the filled large-format imprinted structure 5 includes the display 6 having a plurality of pixels (e.g. first, second, and third pixels 16, 26, 36) separated by pixel gaps P located beneath the first cured layer 10. The fourth micro-cavity 42 is located at least partly above the pixel gaps P. The overlapped portions of the first, second and third cured materials 14, 24, 34 effectively form a black filter when the first, second, and third cured materials 14, 24, 34 have different primary colors. For example, red light passed through the first cured materials 14 is absorbed by green second cured material 24 or by blue third cured material 34. Similarly, green light passed through green second cured material 24 is absorbed by blue third cured material 34.

According to embodiments of the present invention, the first micro-cavity 12 is less than or equal to 20 microns wide, the second micro-cavity 22 is less than or equal to 20 microns wide, or the third micro-cavity 32 is less than or equal to 20 microns wide.

Figure 5:
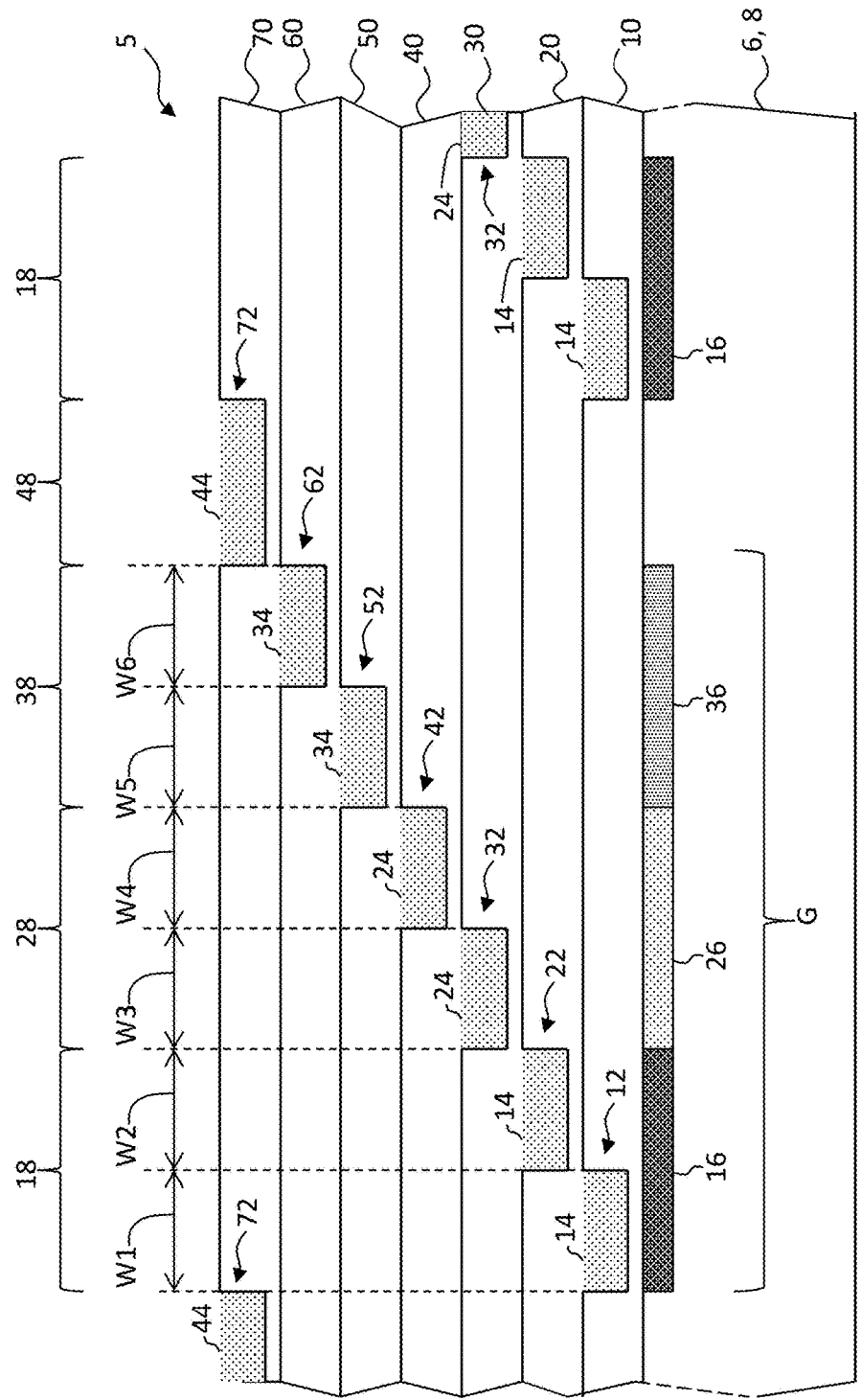
FIG. 5 is a cross-sectional view of yet another multi-layer filled large-format imprinted structure with multiple micro-cavities per display pixel in an embodiment of the present invention.

The present invention is especially useful when relatively large areas are imprinted or filled. In particular as noted above with respect to FIG. 10, experimentation has shown that large imprinted areas, for example of the size corresponding to a pixel are difficult to fill and cure uniformly. Hence, according to another embodiment of the present invention and as illustrated in FIG. 5, a filled large-format imprinted structure 5 useful for color filters includes the substrate 8. The first cured layer 10 is located over the substrate 8. One or more first micro-cavities 12 are imprinted in the first cured layer 10, each first micro-cavity 12 having a first micro-cavity width W1 less than or equal to 20 microns. The second cured layer 20 is located over the first layer 10 and the one or more first micro-cavities 12. One or more second micro-cavities 22 is imprinted in the second cured layer 20, each of the second micro-cavities 22 having a second micro-cavity width W2 less than or equal to 20 microns. A common cured material (e.g. first cured material 14) is located in the first micro-cavity 12 and in the second micro-cavity 22, thereby defining the filled large-format imprinted structure 5. In an embodiment, the cured material is a color filter. The first and second micro-cavities 12, 22, and first cured materials 14 make up a first area 18 that corresponds to the area of the first pixel 16.

In a further embodiment of the present invention, the third cured layer 30 is located over the second cured layer 20 and the one or more second micro-cavities 22. One or more third micro-cavities 32 is imprinted in the third cured layer 30, each third micro-cavity 32 having a third micro-cavity width W3 less than or equal to 20 microns. A fourth cured layer 40 is located over the third layer 30 and the one or more third micro-cavities 32. One or more fourth micro-cavities 42 is imprinted in the fourth cured layer 40, each fourth micro-cavity 42 having a fourth micro-cavity width W4 less than or equal to 20 microns. A common cured material (e.g. second cured material 24) is located in the third micro-cavity 32 and in the fourth micro-cavity 42. The third and fourth micro-cavities 32, 42, and second cured materials 24 make up a second area 28 that corresponds to the area of the second pixel 26.

A fifth cured layer 50 is located over the fourth layer 40 and the one or more fourth micro-cavities 42. One or more fifth micro-cavities 52 is imprinted in the fifth cured layer 50, each fifth micro-cavity 52 having a fifth micro-cavity width W5 less than or equal to 20 microns. A sixth cured layer 60 is located over the fifth cured layer 50 and the one or more fifth micro-cavities 52. One or more sixth micro-cavities 62 is imprinted in the sixth cured layer 60, each sixth micro-cavity 62 having a sixth micro-cavity width W6 less than or equal to 20 microns. A common cured material (e.g. third cured material 34) is located in the fifth micro-cavity 52 and in the sixth micro-cavity 62. The fifth and sixth micro-cavities 52, 62, and third cured materials 34 make up a third area 38 that corresponds to the area of the third pixel 36.

In yet another embodiment, a seventh cured layer 70 is located over the sixth cured layer 60 and the one or more sixth micro-cavities 62. One or more seventh micro-cavities 72 are imprinted in the seventh cured layer 70 and include cured material (e.g. fourth cured material 44) therein. In an embodiment, the width of the seventh micro-cavities is less than 20 microns. Although not shown, in an embodiment an eighth layer with imprinted micro-cavities is also formed over the seventh cured layer 70 and includes the same cured material as in the seventh micro-cavities 72.

As in other embodiments of the present invention, the substrate 8 can be the display 6 or element of the display 6 such as the display cover or display substrate. The display 6 can have first, second, and third pixels 16, 26, 36 arranged in groups G to form full-color pixels. The first cured material 14 in the first and second micro-cavities 12, 22 are associated with the first pixel 16 of the display 6 and can form a single effective color filter for the first pixel 16. Likewise, the second cured material 24 in the third and fourth micro-cavities 32, 42 are associated with the pixel 26 of the display 6 and can form a single effective color filter for the pixel 26. Similarly, the third cured material 34 in the fifth and sixth micro-cavities 52, 62 are associated with the pixel 36 of the display 6 and can form a single effective color filter for the pixel 26. In a useful embodiment, the cured material in the seventh layer 70 (and eighth layer, if present) is a black fourth cured material 44 and serves as a black matrix for the display 6.

Thus, in an embodiment of the present invention, the filled large-format imprinted structure 5 further includes the display 6 located beneath the first cured layer 10. The display 6 has a single pixel (e.g. first pixel 16) located at least partially beneath the first and at least partially beneath the second micro-cavities 12, 22. Thus, the cured material 14 in the first and second micro-cavities 12, 22 serve as a single effective color filter for the first pixel 16.

Although FIG. 5 illustrates two layers having the same cured material in separate micro-cavities in each of the two layers to form a single effective color filter, in other embodiments more than two layers are used and the cured material in each micro-cavity of the layers has a common material forming a single color filter. By locating the same cured material in two (or more) layers, a larger effective color filter in multiple layers is formed for a single pixel. Thus, effective color filters larger than the size of a single imprinted and filled micro-cavity are formed in a simple, repetitive coat, imprint, and fill process and associated in the display 6 with pixels that are larger than structures readily formed by imprinting processes.

Referring to FIG. 6A in an alternative embodiment of the filled large-format imprinted structure 5 the first cured layer 10 is formed on the substrate 8 or the display 6 having the single-color first pixel 16. The first cured layer 10 includes two or more first micro-cavities 12 located above the single-color first pixel 16. The second cured layer 20 is formed on the first cured layer 10 and includes two or more second micro-cavities 22 located above the single pixel 16. The first and second micro-cavities 12, 22 in the two layers form the first area 18. The cured material 14 is located in the first and second micro-cavities 12, 22 forming a single effective color filter having a size equal to four times the size of one of the first or second micro-cavities 12, 22. Each cured layer can include more than two separated micro-cavities, for example having a width of 20 microns or less, to form a color filter of an arbitrary size. Thus, an advantage of the embodiment of FIG. 6A (and FIG. 6B described below) is that a larger effective area is filled without requiring additional cured layers or causing difficulties with imprinting relatively large areas in a layer.

As shown in FIG. 6A, the two or more first micro-cavities 12 located in the first cured layer 10 are separated by a gap equal to or less than the width of the second micro-cavities 22. Additionally, the two or more second micro-cavities 22 located in the second cured layer 20 are separated by a gap equal to or less than the width of the first micro-cavities 12.

Referring to FIG. 6B, since most displays 6 are viewed at a variety of angles, it is important that light Z emitted or reflected from the first pixel 16 at non-orthogonal angles pass through the color filters. To ensure such light filtering, it is useful for the common cured materials in adjacent layers to overlap. For example, referring to the filled large-format imprinted structure 5 of FIG. 6B the first and second micro-cavities 12, 22 on the substrate 8 or display 6 and the first cured material 14 in the first and second cured layers 10, 20 overlap so that light Z can pass through cured material in both cured layers. Although the amount of first cured material 14 through which light Z from the first pixel 16 passes will vary with the angle of emission or reflection, if the first cured material 14 in the first cured layer 10 overlaps with the first cured material 14 in the second cured layer 20, it is more likely that light Z will pass through at least a portion of the first cured material 14.

In this case, the two or more first micro-cavities 12 located in the first cured layer 10 are separated by the gap P less than the width W2 of the second micro-cavities. Similarly, the two or more second micro-cavities 22 located in the second cured layer 10 are separated by the gap P less than the width W1 of the first micro-cavities 12.

The cured layers 10, 20, 30, 40, 50, 60, 70 are illustrated in a particular order in FIG. 5, but can be provided in any order above or below the substrate 8.

According to embodiments of the present invention, the first and second cured layers 10 and 20 of the embodiments of FIGS. 5, 6A, and 6B serve as the single cured layer 10 of the embodiments of FIGS. 1, 3 and 4. Similarly, the third and fourth cured layers 30 and 40 of the embodiments of FIG. 5 serves as the single cured layer 20 of the embodiments of FIGS. 1, 3 and 4 and the fifth and sixth cured layers 50 and 60 of the embodiment of FIG. 5 serves as the single cured layer 30 of the embodiments of FIGS. 1, 3 and 4. Thus, the structures discussed with reference to FIGS. 1-4 above are also applicable to the structures of FIGS. 5 and 6 so that in embodiments, the substrate 8 and the cured layers 10, 20, 30, 40, 50, 60, 70 are transparent or the cured layers 10, 20, 30, 40, 50, 60, 70 can have different thicknesses. Likewise, the micro-cavities 12, 22, 32, 42, 52, 62, 72 and the cured materials 14, 24, 34, 44 can have different thicknesses or spatial areas, are separated by gaps so that the cured materials 14, 24, 34, 44 are aligned and do not overlap, are separated by a gap and do not overlap, or overlap. Likewise in an embodiment, the first cured materials 14 are located between the second cured materials 24 or the second and third cured materials 24, 34 in a direction parallel to a surface of the substrate 8. Similarly, in an embodiment, the second cured materials 24 are located between the first cured materials 14 or the first and third cured materials 14, 34 in a direction parallel to a surface of the substrate 8 and the third cured materials 34 are located between the first cured materials 14 or the first and second cured materials 14, 24 in a direction parallel to a surface of the substrate 8. Additionally, the fourth cured material 44 is located between any or all of the first, second, or third cured materials 14, 24, 34 in a direction parallel to a surface of the substrate 8. Alternatively, the first cured materials can overlap with the second or third cured materials 24, 34 and the second cured materials 24 can overlap with the third cured materials 34 in a direction orthogonal to a surface of the substrate 8.

Figure 7:
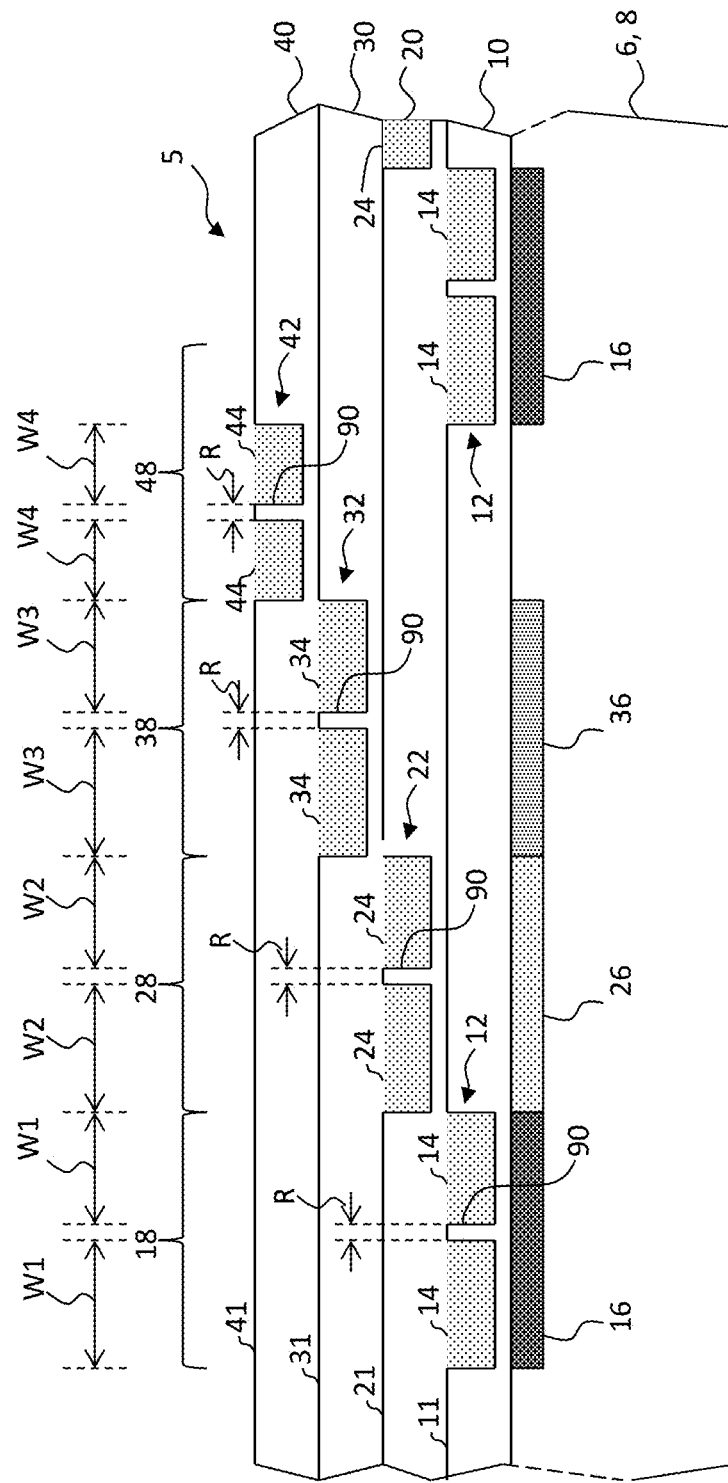
FIG. 7 is a cross-sectional view of an alternative multi-layer filled large-format imprinted structure with ribs in an embodiment of the present invention.
Figure 8:
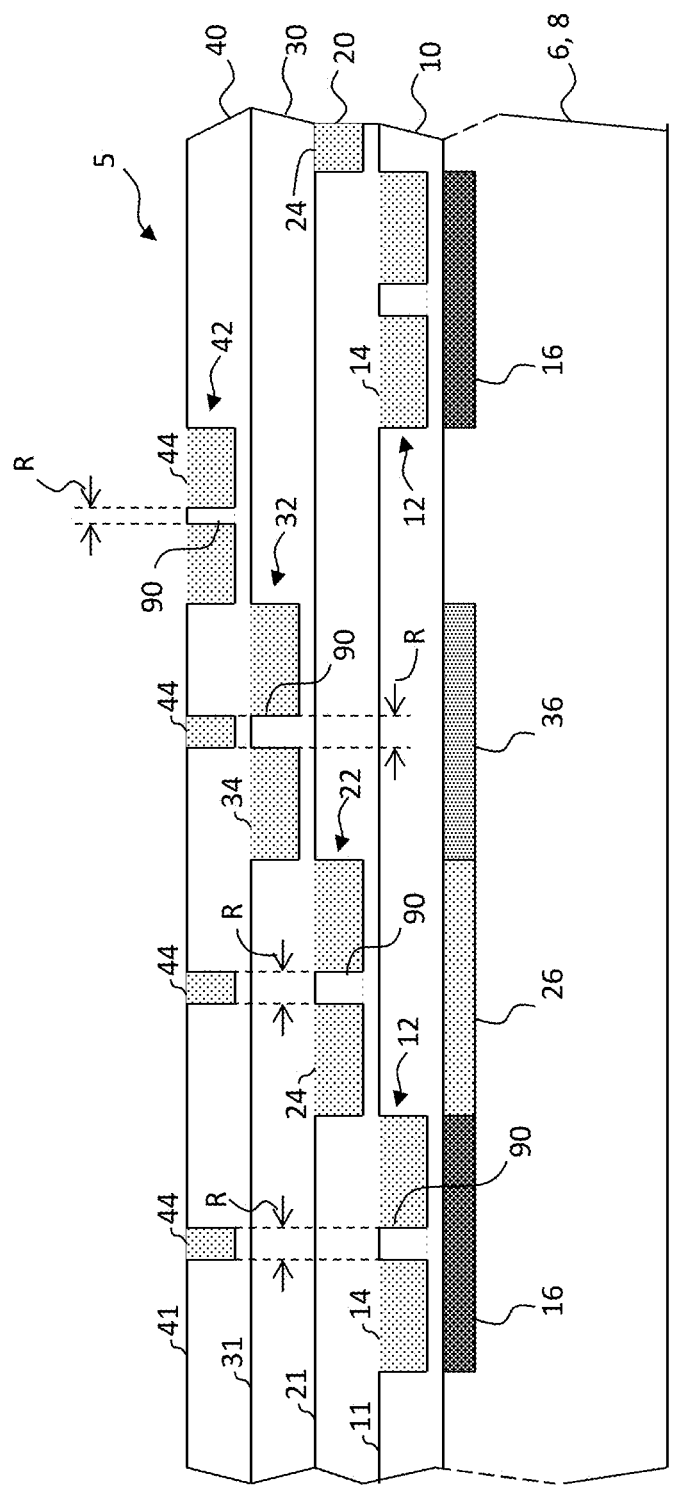
FIG. 8 is a cross-sectional view of an alternative multi-layer filled large-format imprinted structure with variable width ribs in an embodiment of the present invention.

The embodiments of the present invention shown in FIGS. 1-6B illustrate large imprinted structures composed of multiple layers of smaller adjacent or overlapping structures. In another embodiment of the present invention, multiple structures are provided in a common layer and correspond to a single pixel. Referring to FIGS. 7 and 8, a filled large-format imprinted structure 5 includes the first cured layer 10 including a first cured layer surface 11 having one or more first areas 18. The first cured layer 10 is formed on the substrate 8, for example a cover or substrate of the display 6. A plurality of first micro-cavities 12 are imprinted in each first area 18, each of the first micro-cavities 12 having a micro-cavity width W1 less than or equal to 20 microns. A rib 90 separates each first micro-cavity 12 from an adjacent first micro-cavity 12 by a rib width R that is less than the first micro-cavity width W1, the rib 90 extending from a bottom of the first micro-cavity 12 to the first cured layer surface 11. The common first cured material 14 is in each first micro-cavity 12, thereby defining the filled large-format imprinted structure 5. In an embodiment, the common first cured material 14 is a color filter.

In a further embodiment of the present invention, the large-format imprinted structure 5 includes the second cured layer 20 having a second cured layer surface 21 having one or more second areas 28. The second cured layer 20 is formed on the first cured layer 10, the first micro-cavities 12, and the first cured materials 14. A plurality of second micro-cavities 22 are imprinted in each second area 28, each of the second micro-cavities 22 having a micro-cavity width W2 less than or equal to 20 microns. The rib 90 separates each second micro-cavity 22 from an adjacent second micro-cavity 22 by a rib width R that is less than the second micro-cavity width W2, the rib 90 extending from a bottom of the second micro-cavity 22 to the second cured layer surface 21. In an embodiment, the plurality of second micro-cavities 22 and rib 90 are located at least partly between the first micro-cavities 12 in a direction parallel to a substrate surface. A common second cured material 24 is in each second micro-cavity 22. In an embodiment, the common second cured material 24 is a color filter.

In another embodiment of the present invention, the large-format imprinted structure 5 includes the third cured layer 30 having a third cured layer surface 31 having one or more third areas 38. The third cured layer 30 is formed on the second cured layer 20, the second micro-cavities 22, and the second cured materials 24. A plurality of third micro-cavities 32 are imprinted in each third area 38, each of the third micro-cavities 32 having a micro-cavity width W3 less than or equal to 20 microns. The rib 90 separates each third micro-cavity 32 from an adjacent third micro-cavity 32 by a rib width R that is less than the third micro-cavity width W3, the rib 90 extending from a bottom of the third micro-cavity 32 to the third cured layer surface 31. In an embodiment, the plurality of third micro-cavities 32 and rib 90 are located at least partly between the first micro-cavities 12 or second micro-cavities 22 in a direction parallel to a substrate surface. A common third cured material 34 is in each third micro-cavity 32. In an embodiment, the common third cured material 34 is a color filter.

In yet another embodiment of the present invention, the large-format imprinted structure 5 includes the fourth cured layer 40 having a fourth cured layer surface 41 having one or more fourth areas 48. The fourth cured layer 40 is formed on the third cured layer 30, the third micro-cavities 32, and the third cured materials 34. A plurality of fourth micro-cavities 42 are imprinted in each fourth area 48, each of the fourth micro-cavities 42 having a micro-cavity width W4 less than or equal to 20 microns. The rib 90 separates each fourth micro-cavity 42 from an adjacent fourth micro-cavity 42 by a rib width R that is less than the fourth micro-cavity width W4, the rib 90 extending from a bottom of the fourth micro-cavity 42 to the fourth cured layer surface 41. The common fourth cured material 44 is in each fourth micro-cavity 42.

In other embodiments, the ribs 90 have a width that is less than or equal to 20 microns, for example 10 microns, 5 microns, two microns, or one micron. Alternatively, the ribs 90 have a rib width R that is less than or equal to one half, one quarter, one tenth, or one twentieth of the width (W1, W2, W3, W4) of the micro-cavities (12, 22, 32, 42) that the ribs 90 separate. For example, in the first cured layer 10, the rib 90 has a width R that is one tenth of the width W1 of the first micro-channel 12. The micro-cavities 12, 22, 32, 42 in each cured layer 10, 20, 30, 40 respectively can have a depth that is less than the cured layer thickness or less than 20 microns. Referring specifically to FIG. 8 in a further embodiment, the rib widths R of ribs 90 separating the different micro-channels are different. As shown in FIG. 8, the rib width R separating the fourth micro-channels 42 and the fourth cured materials 44 in the fourth cured layer 40 is greater than the rib widths R separating the first, second, and third micro-cavities 12, 22, 32 and the first, second, and third cured materials 14, 24, 34 in the first, second, and third cured layer 10, 20, 30.

In an embodiment, the common fourth cured material 44 is a color filter or a black material forming a black matrix and the first, second, and third cured materials are red, green, and blue cured materials. Although the cured layers 10, 20, 30, 40 are illustrated in a particular order in FIG. 7, they can be provided in any order above or below the substrate 8.

Referring further to FIG. 8 and according to another embodiment of the present invention, fourth cured material 44 in fourth micro-cavities 42 in fourth cured layer 40 is located above or below the ribs 90 in a direction perpendicular to a surface of the substrate 8. As noted above, in an embodiment the fourth cured material 40 is black and forms a black matrix layer. As shown in FIG. 8, at least some of the fourth cured material 44 acts as a light absorber for light that could otherwise be emitted through or reflected by the ribs 90.

In another embodiment, not separately illustrated, the fourth cured layer 40 includes only fourth micro-cavities 42 aligned with the ribs 90 in the first, second, or third cured layers 10, 20, 30. In such an arrangement, one or more fourth micro-cavities 42 are imprinted in the fourth cured layer 40, each of the second micro-cavities 42 having a micro-cavity width and a micro-cavity height both less than or equal to 20 microns. The fourth cured material 44, for example a black material, is located in each fourth micro-cavity 42. The fourth micro-cavities 42 are located above or below the ribs 90 in a direction perpendicular to a surface of the substrate 8. Although labeled as the fourth cured layer 40 in FIG. 8, the same structure is useful in combination with a single cured layer, such as first cured layer 10, in which case the fourth cured layer 40, the fourth micro-cavities 42 and the fourth cured material 44 become a second cured layer 20 with second micro-cavities 22 and second cured materials 24. As noted above, the layers can be in any order and the numbering of the layers is arbitrary.

In an embodiment, the first, second, and third cured materials 14, 24, 34 have different colors, for example red, green, and blue and the fourth cured material 44 is black. In various embodiments, any of these colors could be provided in the cured materials of any of the cured layers.

In another embodiment, one of the plurality of micro-cavities imprinted in an area is a different size or a different shape than another of the plurality of micro-cavities imprinted in the area.

As shown in FIGS. 7 and 8, the large-format imprinted structure 5 further includes the display 6 beneath the first cured layer 10, the display 6 having the first pixel 16 located at least partially beneath the first area 18. In further embodiments, the large-format imprinted structure 5 further includes second and third pixels 26, 36 located at least partially beneath each of the second and third areas 28, 38, respectively. Each plurality of first, second, or the third micro-cavities 12, 22, 32 and ribs 90 is located in the first, second, or third areas 18, 28, 38, respectively and associated with the corresponding first, second, or third pixels 16, 26, 36. The first, second, and third cured materials 14, 24, 34 are color filters for the corresponding first, second, or third pixels 16, 26, 36 and has one of the colors red, green, and blue, and the fourth cured material 44 is black. The pixel can have a shape and the plurality of micro-cavities imprinted in an area together has a shape that corresponds to the shape of a pixel. A corresponding shape is a similar shape or a shape that substantially or completely covers the pixel.

The embodiments of FIGS. 7 and 8 provide an advantage of requiring fewer cured layers.

FIGS. 7 and 8 illustrate a micro-cavity structure that has a rib separating micro-cavities in an area that extends from the bottom of the micro-cavities to the surface of the cured layer in which the micro-cavities are formed. In an alternative embodiment illustrated in FIG. 9, first, second, third, and fourth cured layers 10, 20, 30, 40 are formed over the substrate 8 such as the display 6 or display component such as a cover or substrate. First, second, third, and fourth micro-cavities 12, 22, 32, 42 are formed in the first, second, third, and fourth cured layers 10, 20, 30, 40, respectively. The rib 90 is formed within each micro-cavity that extends from the bottom of the micro-cavity to a location lower than the surface of the cured layer in which the micro-cavities are formed. In such an embodiment, a filled large-format imprinted structure 5 includes the first cured layer 10 including the first cured layer surface 11. One or more first micro-cavities 12 are imprinted in the first cured layer 10, each first micro-cavity 12 having a first micro-cavity width W1 and a first micro-cavity depth D1. One or more ribs 90 are imprinted in each first micro-cavity 12 and extend from the bottom of the first micro-cavity 12 toward the top of the first micro-cavity 12, each rib 90 having a rib width R that is less than one half of the first micro-cavity width W1, a rib height H that is less than the micro-cavity depth D1, and each rib 90 separating the first micro-cavity 12 into portions O, each portion O having a portion width OW less than or equal to 20 microns. The first cured material 14 is located in each portion O of the first micro-cavity 12 and extends over the top of the rib 90, thereby defining a filled large-format imprinted structure 5.

In various embodiments of the present invention (see also FIG. 1), the first, second, third, or fourth cured material 14, 24, 34, 44 is a color filter or is black, the first, second, third, or fourth micro-cavity depth D1, D2, D3, D4 is less than the cured layer thickness S1, S2, S3, S4, respectively, or the first, second, third, or fourth cured layer 10, 20, 30, 40 is substantially transparent or has different thicknesses. In an embodiment, one of the first, second, third, or fourth micro-cavities 12, 22, 32, 42 has a different spatial area than another of the first, second, third, or fourth micro-cavities 12, 22, 32, 42. In another embodiment, at least one portion O of the first, second, third, or fourth micro-cavity 12, 22, 32, 42 has a different size, a different shape, or a different area than another portion O of the first, second, third, or fourth micro-cavity 12, 22, 32, 42. The first, second, third, or fourth cured material 14, 24, 34, 44 can have different colors.

In a further embodiment, the large-format imprinted structure 5 further includes the display 6 beneath the first cured layer 10 and the display 6 has the first pixel 16 located at least partially beneath the first micro-cavity. The first pixel 16 can have a shape and the first micro-cavity 12 can have a shape that corresponds to the shape of the first pixel 16. Further, the display 6 can have a second and third pixels 26, 36 located at least partially beneath the second and third micro-cavities 22, 32, respectively. Each plurality of first, second, or the third micro-cavities 12, 22, 32 and ribs 90 is located in the first, second, or third areas 18, 28, 38, respectively and associated with the corresponding first, second, or third pixels 16, 26, 36. In an embodiment, the first, second, and third cured materials 14, 24, 34 are color filters having one of the colors red, green, and blue, and the fourth cured material 44 is black. Although not shown in FIG. 9, the light-absorbing fourth cured material 44 of FIG. 8 located above the ribs 90 is usable above the ribs 90 in the embodiment of FIG. 9.

Figure 9:
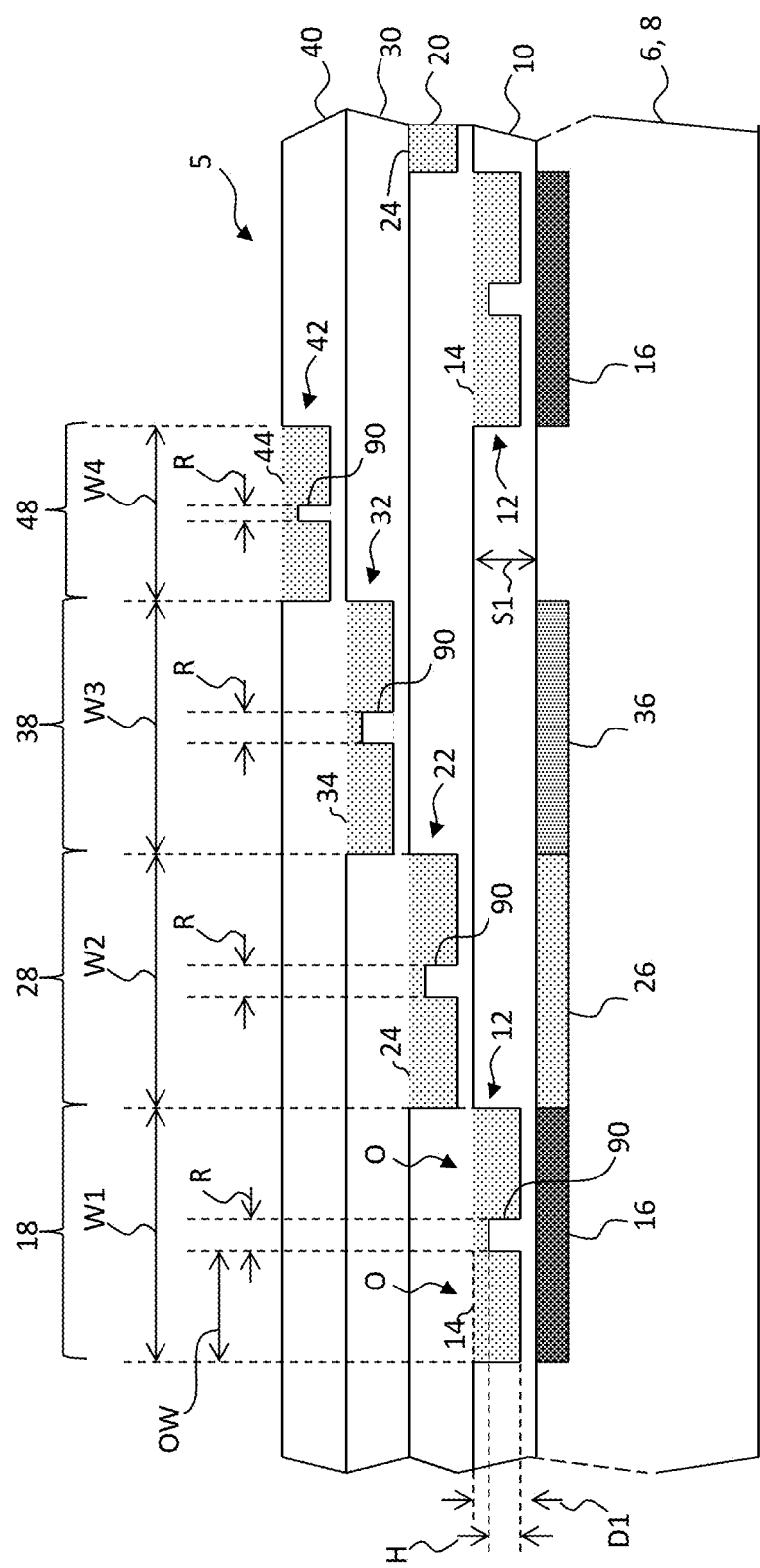
FIG. 9 is a cross-sectional view of an alternative multi-layer filled large-format imprinted structure with short ribs in an embodiment of the present invention.

The embodiments illustrated in FIGS. 7, 8, and 9 have an advantage in that the ribs serve to prevent a mechanical device that removes material from the surface of the cured layers from also removing material from the micro-cavities, or at least serve to reduce the amount of material removed from the micro-cavities. The full-height ribs 90 of FIGS. 7 and 8 are more effective at reducing the impact of mechanical cured surface wiping but can permit light to pass through the ribs 90. In contrast, the shorter ribs 90 of FIG. 9 are less effective at reducing the impact of mechanical cured surface wiping but filter, at least somewhat, light passing through the ribs 90.

In an embodiment, the cured layers 10, 20, 30, 40 of FIGS. 7, 8, and 9 correspond to the cured layers 10, 20, 30, 40 of FIG. 1, respectively. Thus, the structures discussed with reference to FIGS. 1-4 above are also applicable to the structures of FIGS. 7, 8, and 9 so that in embodiments, the substrate 8 and cured layers 10, 20, 30, 40 of FIGS. 7, 8, and 9 are transparent or the cured layers 10, 20, 30, 40 of FIGS. 7, 8, and 9 can have different thicknesses. Likewise, the micro-cavities 12, 22, 32, 42 of FIGS. 7, 8, and 9 and the cured materials 14, 24, 34, 44 of FIGS. 7, 8, and 9 can have different thicknesses or spatial areas, are separated by gaps so that the cured materials 14, 24, 34, 44 are aligned and do not overlap, are separated by a gap and do not overlap, or overlap. Likewise in an embodiment, the first cured materials 14 are located between the second cured materials 24 or second and third cured materials 24, 34 in a direction parallel to a surface of the substrate 8. Similarly, in an embodiment, the second cured materials 24 are located between the first cured materials 14 or first and third cured materials 14, 34 in a direction parallel to a surface of the substrate 8 and the third cured materials 34 are located between the first cured materials 14 or first and second cured materials 14, 24 in a direction parallel to a surface of the substrate 8. Additionally, the fourth cured material 44 is located between any or all of the first, second, or third cured materials 14, 24, 34 in a direction parallel to a surface of the substrate 8. Alternatively, the first cured materials 14 can overlap with the second or third cured materials 24, 34 and the second cured materials 24 can overlap with the third cured materials 34 in a direction orthogonal to a surface of the substrate 8.

In operation for each of the embodiments, a display controller (not shown) controls the first, second, and third pixels 16, 26, 36 of the display 6 to emit, reflect, or transmit light Z through the corresponding first, second, and third cured materials 14, 24, 34 to filter the light Z and provide colored-light pixels for the display 6 as illustrated in FIG. 1. Overlapping micro-cavities such as those illustrated in FIGS. 4 and 6B, more effectively filter light Z emitted, transmitted, or reflected at a non-orthogonal angle. The first, second, and third cured materials 14, 24, 34 can serve as color filters to provide full-color pixels for display 6 in which the display 6 is a white-light emitter, for example with an LCD backlight or a white-light emitter in an OLED display. Black materials located between pixels (FIG. 3), between groups of pixels (FIG. 3), or above ribs separating micro-pixels in an area (FIG. 8) absorb incident ambient light or emitted, transmitted, or reflected display white light so as to improve the contrast of the display 6.

Figures 11, 12:
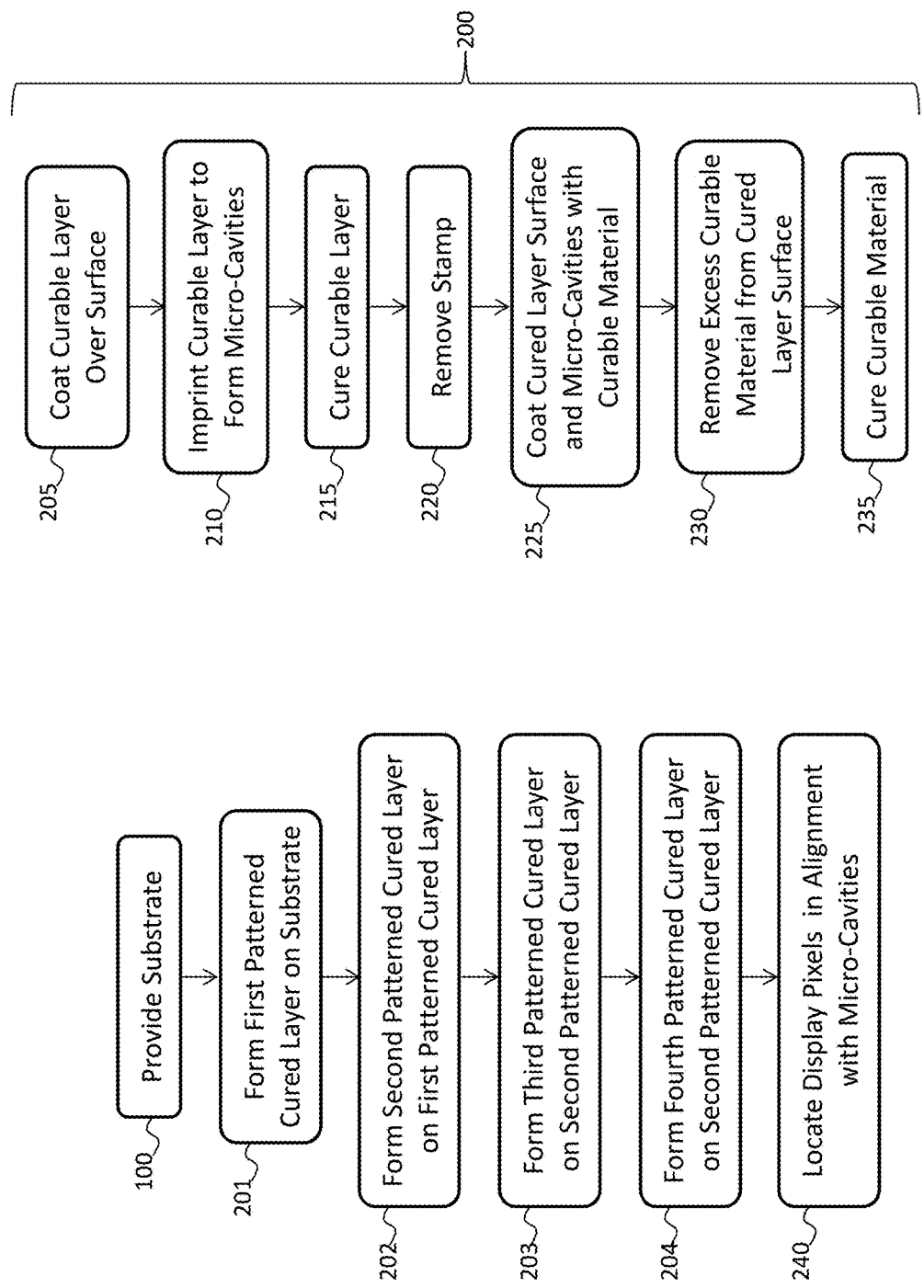
FIGS. 11-12 are flow diagrams illustrating various methods of the present invention.

All of the embodiments illustrated in the figures and discussed above can be constructed using similar or the same methods and processes. Referring first to FIG. 11, in step 100 the substrate 8 is provided. In various embodiments, the substrate 8 is transparent, flexible, or rigid and has a substantially planar surface. Glass or plastic can both be used. In an embodiment, the substrate 8 is a component of the display 6, such as a display substrate or display cover of an LCD or OLED display. Sequential steps 201 through 204 are similar steps for forming sequential cured layers on the substrate 8. In step 201, the first cured layer 10 is formed over the substrate 8, patterned to make the first micro-cavities 12, and the first micro-cavities 12 filled with the first cured material 14. In step 202, the second cured layer 20 is formed over the first cured layer 10, the first micro-cavities 12, and the first cured materials 14. The second cured layer 20 is patterned to make the second micro-cavities 22, and the second micro-cavities 22 are filled with the second cured material 24. In step 203, the third cured layer 30 is formed over the second cured layer 20, the second micro-cavities 22, and the second cured materials 24. The third cured layer 30 is patterned to make the third micro-cavities 32, and the third micro-cavities 32 are filled with the third cured material 34. In step 204, the fourth cured layer 40 is formed over the third cured layer 30, the third micro-cavities 32, and the third cured materials 34. The fourth cured layer 40 is patterned to make the fourth micro-cavities 42, and the fourth micro-cavities 42 are filled with the fourth cured material 44. Although the steps 201-204 are illustrated in an order, these four steps can be performed in any desired order and still form effective structures of the present invention. The steps 201-204 can be repeated as many times as necessary to provide the number of imprinted layers desired, for example seven times as illustrated in the structure of FIG. 5.

Each of the steps 201-204 can be performed using the steps 205-235 of step 200 illustrated in FIG. 12. Referring to FIG. 12, in step 205 a curable layer is coated over a surface. The curable layer can be, for example, a cross-linkable resin known in the art. Alternatively, a layer of curable material is laminated over the surface. Coating methods can include slot coating, curtain coating, or spin coating and laminating methods are known in the art. The curable layer is mechanically imprinted (stamped or embossed) in step 210 with a stamp having a surface with relief features corresponding to the desired micro-cavities and any ribs at the desired locations. Mechanical imprinting methods and stamp construction methods are known in the art. The curable layer is cured in step 220, for example with heat or ultra-violet radiation, to form a cured layer (e.g. first, second, third, or fourth cured layers 10, 20, 30, 40) having micro-cavities (e.g. first, second, third, or fourth micro-cavities 12, 22, 32, 42). In an embodiment, the curable layer is cured by exposure through the substrate 8. In another embodiment, the curable layer is cured by exposure from a side of the curable layer opposite the substrate. Since the cured materials can include light filtering or absorbing materials, curing the curable layers and materials from a side of the curable layer opposite the substrate is advantageous in some embodiments. Such curing methods are known. The imprinting stamp is mechanically removed in step 220.

In step 225, the cured layer surface and the micro-cavities are coated with a curable material, for example a cross-linkable material in liquid form with dyes or pigments using coating methods known in the art, for example spray or curtain coating. Excess curable material is removed from the surface of the cured layer (but not the micro-cavities) in step 230, for example by wiping the surface, using methods known in the art. In the prior art, this wiping step is problematic since it can remove curable material that is desirably located in the micro-cavities. The limitation of micro-cavity width to 20 microns or less and the use of ribs within or separating micro-cavities mitigate this wiping problem in various embodiments of the present invention. Once the excess curable material is removed, the remaining curable material in the micro-cavities is cured in step 235, for example by drying, heating, or exposure to radiation, as is known in the art. As noted above with reference to FIG. 10, curable materials that have a proportion of liquid and that are located in relatively large micro-cavities such as those with a dimension greater than 20 microns, tend to dry non-uniformly, in particular the thickness of the dried, cured material tends to be thinner at the center of the micro-cavity than at the edges. The limitation of micro-cavity width to 20 microns or less and the use of ribs within or separating micro-cavities also mitigate this curing problem in various embodiments of the present invention. Although drying non-uniformity problems can also be addressed by other methods known in the art (by controlling the material composition and drying conditions, for example), the present invention provides an alternative simpler, easier, and lower-cost method for mitigating the problem. Alternatively, the curable material is deposited in the micro-cavities, for example using ink jet deposition devices.

In an embodiment, the steps 225 to 235 are repeated for each cured layer until the micro-cavities in the layer are satisfactorily filled with cured material.

The use of multiple layers having micro-cavities filled with cured material or ribs within or separating micro-cavities in a layer enable filled large-format imprinted structures 5 that are larger than those made by other methods known in the art. In turn, the filled large-format micro-cavity structures 5 enable color filters or black matrix structures that are useful with displays having pixels with a spatial dimension greater than 20 microns.

The different steps 201-204 of FIG. 11 can be performed using the same equipment in the same way, reducing manufacturing costs. The cured layers (e.g. first, second, third, or fourth cured layers 10, 20, 30, 40) can have the same materials and can be coated in the same way (step 205 in FIG. 12). The micro-cavities (e.g. first, second, third, or fourth micro-cavities 12, 22, 32, 42) are located in different locations in the corresponding cured layers and, if ribs 90 are employed have a different structure. These different locations and structures can be imprinted using different stamps (in step 210 of FIG. 12), each stamp having a relief structure corresponding to the micro-cavity structure of the particular curable layer imprinted. In some cases, if the micro-cavities themselves are identical in different cured layers but have different locations, the same stamp can be used but is registered and aligned to a different location over the substrate 8. In any case, the same imprinting and registration mechanism can be used. The stamps can be registered to align the micro-cavities with the location of display pixels, to align with the micro-cavities in other cured layers, or to provide desired overlap between micro-cavities in different cured layers. The curing and stamp removal steps (steps 215 and 220 in FIG. 12) are identical for each curable layer, as is the coating step (step 225). However, in useful embodiments the curable material used for each layer is different, for example a common curable material (such as a cross-linkable resin) with different additives, such as colored pigments to form different color filters when cured. The remaining removal step (step 230) and curing step (stamp 235) can be the same.

Thus, the present invention provides a way to construct a variety of multi-layer micro-cavity structures using common steps and with differences for each layer only in the imprinting stamp and in the selection of curable materials for filling the imprinted micro-cavities in each layer. For example, in the embodiment of FIG. 3, the imprinting stamp for the first cured layer 10 has relief features corresponding to the first micro-cavities 12 aligned with the first pixels 16, the imprinting stamp for the second cured layer 20 has relief features corresponding to the second micro-cavities 22 aligned with the second pixels 26, the imprinting stamp for the third cured layer 30 has relief features corresponding to the third micro-cavities 32 aligned with the third pixels 36, and the imprinting stamp for the fourth cured layer 40 has relief features corresponding to the gaps between the micro-cavities in the other layers. FIGS. 5, 6A, and 6B illustrate a structure that requires multiple cured layers for one pixel and an imprinting stamp that imprints micro-cavities at different locations in each cured layer. The same imprinting stamp with a different registration over the substrate 8 can be used for each cured layer or a commonly registered different imprinting stamp used for each cured layer with relief features in locations corresponding to the different locations of the desired micro-cavities. In this case, each of the steps 201-204 are repeated twice sequentially with the different imprinting stamps with a common cured material located in the micro-cavities of each cured layer associated with the same pixel. In step 240, the display 6 with pixels (e.g. first, second, and third pixels 16, 26, 36) is aligned with the first, second, and third micro-cavities 12, 22, 32 and first, second, third, and fourth cured materials 14, 24, 34, 44.

In an alternative method, the micro-cavities are formed in alignment with the first, second, and third pixels 16, 26, 36 of the display 6. In the embodiment of FIG. 5, a pixel (e.g. first, second, or third pixels 16, 26, 36) is aligned with the micro-cavities (e.g. first, second, or third micro-cavities 12, 22, 32) and cured material (e.g. first, second, or third cured materials 14, 24, 34) in an area (e.g. first, second, or third areas 18, 28, 38) so that light from the pixel passes through any of the micro-cavities and cured material in the area. By aligned is meant that light Z (FIG. 1) emitted, reflected, or transmitted by the first, second, or third pixels 16, 26, 36 passes through the first, second, or third micro-cavities 12, 22, 32 and first, second, or third, cured materials 14, 24, 34, respectively. In an embodiment, the first, second, and third micro-cavities 12, 22, 32 and first, second, and third, cured materials 14, 24, 34 are located above or below at least a portion of the first, second, and third pixels 16, 26, 36 in a direction perpendicular to a surface of the substrate 8.

The structures of FIGS. 7, 8, and 9 can be formed using the same process as that used for FIG. 3 but with different imprinting stamps. In the cases illustrated in FIGS. 7, 8, and 9 the imprinting stamps contain relief features that form the ribs 90 when applied to a curable layer.

In a further embodiment of the present invention, the first cured material 14 is cross-linked to the first cured layer 10, the second cured material 24 is cross-linked to the second cured layer 20, the third cured material 34 is cross-linked to the third cured layer 30, or the fourth cured material 44 is cross-linked to the fourth cured layer 40. Alternatively, the first cured layer 10 is cross-linked to the second cured layer 20, the second cured layer 20 is cross-linked to the third cured layer 30, or the fourth cured layer 40 is cross-linked to the third cured layer 40. More generally, any cured layer is cross linked to a cured layer with which it is in contact or the cured material in the cured layer.

In such embodiments, both the curable materials and the curable layers include cross-linkable materials that cross link when cured. For example, both the first curable material 14 and the first curable layer 10 can include a common curable resin, for example cured with ultra-violet radiation or heat, that cross links when cured. Such cross-linking between the first cured material 14 and the first cured layer 10 improves the strength and the scratch resistance of the imprinted structure. This is accomplished by only partially curing the curable layer and then more completely curing the curable layer at the same time as the curable material is cured. Similarly, two curable layers that are in contact can be cross-linked by only partially curing the first located curable layer or curable material and then more completely curing the curable layer or curable material when the second curable layer is cured. More generally, the curable layers or curable materials are only cured sufficiently at each step to enable the subsequent processing step (for example coating the second curable material over the first cured layer surface or coating the second curable layer over the first cured material). Each subsequent cure step then cures the layers present more completely until, at the end, the entire structure is completely cured. Such partial curing steps at each stage of the process also reduce processing time and intensity of radiation or heat in the curing steps. Thus, according to an embodiment of the present invention, the curing step is a partial curing step and layers or materials are repeatedly partially cured. By cross-linking the various curable layers and materials, the filled large-format imprinted structure 5 is strengthened.

According to various embodiments of the present invention, the substrate 8 is any material having a substrate surface on which the first curable layer 10 can be formed. For example, glass and plastic are suitable materials known in the art from which the substrates 8 can be made into sheets of material having substantially parallel opposed sides, one of which is the substrate surface. In various embodiments, substrate 8 is rigid, flexible, or transparent. The substrate 8 can have a wide variety of thicknesses, for example 10 microns, 50 microns, 100 microns, 1 mm, or more.

Methods for the preparation, coating, and curing of light-absorbing curable materials including pigments, dyes, or carbon black are known, as are ultra-violet and heat curable cross-linkable resins. In another embodiment, the curable material includes a colored dye or a colored pigment other than black.

In various embodiments, imprinted micro-cavities are holes, indentations, pits, grooves, trenches, or channels formed in the cured layers and extending from a surface of the cured layer (for example first, second, third, or fourth cured layer surface 11, 21, 31, 41) toward the substrate 8. Micro-cavities can have a cross-sectional width W, for example less than or equal to 20 microns, 10 microns, 5 microns, 4 microns, 3 microns, 2 microns, 1 micron, or 0.5 microns. In an embodiment, the cross-sectional depth D of an imprinted micro-cavity is less than or equal to the width of the micro-cavity, less than or equal to twice the width of the micro-cavity, less than or equal to four times the width of the micro-cavity, or less than or equal to ten times the width of the micro-cavity. The micro-cavities can have a rectangular cross-section, as shown. Other cross-sectional shapes, for example trapezoids, are known and are included in the present invention.

Material compositions useful in the curable layer or the curable material can be provided in one state and then processed into another state, for example converted from a liquid state into a solid state. Such conversion can be accomplished in a variety of ways, for example by drying, heating, or exposure to radiation. Furthermore, useful material compositions can include a set of materials that, after deposition and processing, is reduced to a subset of the set of materials, for example by removing solvents from the material composition. For example, a material composition including a solvent is deposited and then processed to remove the solvent leaving a material composition without the solvent in place. Thus, according to embodiments of the present invention, a material composition that is deposited on a layer or in the imprinted micro-cavities is not necessarily the same composition as that found in the cured material composition.

Methods and device for forming and providing substrates, coating substrates and other layers, patterning coated substrates or layers, or pattern-wise depositing materials on a substrate or layer are known in the photo-lithographic arts. Hardware controllers for controlling displays and software for managing display systems are all well known. All of these tools and methods can be usefully employed to design, implement, construct, and operate the present invention. Methods, tools, and devices for operating displays can be used with the present invention.

The present invention is useful in a wide variety of electronic devices. Such devices can include, for example, photovoltaic devices, OLED displays and lighting, LCD displays, inorganic LED displays and lighting, electrophoretic displays, and electrowetting displays.

The invention has been described in detail with particular reference to certain embodiments thereof, but it will be understood that variations and modifications can be effected within the spirit and scope of the invention.

PARTS LIST

A cross section line
D1-D6 depth/thickness
G group
L length
H height
O portion
OW portion width
P, P1, P2 gap
R rib width
S gap
S1 first gap
S2 second gap
S3 third gap
S4 fourth gap
W1-W6 width
Z light
5 large-format imprinted structure
6 display
8 substrate
10 first cured/curable layer
11 first cured layer surface
12 first micro-cavity
14 first cured/curable material
16 first pixel
18 first area
20 second cured/curable layer
21 second cured layer surface
22 second micro-cavity
24 second cured/curable material
26 second pixel
28 second area
30 third cured/curable layer
31 third cured layer surface
32 third micro-cavity
34 third cured/curable material
36 third pixel
38 third area
40 fourth cured/curable layer
41 fourth cured layer surface
42 fourth micro-cavity
44 fourth cured/curable material
48 fourth area
50 fifth cured layer
52 fifth micro-cavity
60 sixth cured layer
62 sixth micro-cavity
70 seventh cured layer
72 seventh micro-cavity
80 overlap
90 rib
100 provide substrate step
200 form patterned cured layer over surface step
201 form first patterned cured layer on substrate step
202 form second patterned cured layer on first patterned cured layer step
203 form second patterned cured layer on first patterned cured layer step
204 form second patterned cured layer on first patterned cured layer step
205 coat curable layer over surface step
210 stamp curable layer to form micro-cavities step
215 cure curable layer step
220 remove stamp step
225 coat cured layer surface and micro-cavities with curable material step
230 remove excess curable material from cured layer surface step
235 cure curable material step
240 align display pixels with micro-cavities step

The invention claimed is:

1. A method of making a filled large-format imprinted structure, comprising:
providing a substrate;
locating a curable layer over the substrate, imprinting the curable layer, and curing the curable layer to form a cured layer including a layer surface having one or more areas, each area having a plurality of imprinted micro-cavities, wherein each micro-cavity has a micro-cavity width less than or equal to 20 microns and a rib separating each micro-cavity from an adjacent micro-cavity by a rib width that is less than the micro-cavity width, the rib extending from a bottom of the micro-cavity to the layer surface;
locating a common curable material in each micro-cavity and curing the curable material to form common cured material in each micro-cavity, thereby defining a filled large-format imprinted structure, wherein the cured material is a color filter;
providing a display having a pixel; and
locating the display beneath the substrate with the cured material in the plurality of micro-cavities located at least partly above the pixel;

wherein the rib width is less than or equal to one tenth of the micro-cavity widths of the adjacent micro-cavities that the rib separates.

2. The method of claim 1, further including coating the curable layer over the substrate.

3. The method of claim 1, further including laminating the curable layer over the substrate.

4. The method of claim 1, further including coating the cured layer and each micro-cavity with the curable material, removing the curable material from the cured layer leaving the curable material in each micro-cavity, and curing the curable material to form the cured material.

5. The method of claim 1, further including depositing the curable material in each micro-cavity and curing the first curable material to form the cured material.

6. The method of claim 1 wherein the cured material is red, green, or blue.

7. The method of claim 1, further including curing the curable material with heat or radiation.

8. The method of claim 1, wherein the provided display includes at least first and second pixels, and wherein the cured material in two or more of the micro-cavities is located at least partly above the first pixel and the cured material in two or more different micro-cavities is located at least partly above the second pixel.

9. The method of claim 1, wherein the cured layer is a first cured layer, the common cured material is a first cured material, and the micro-cavities are first micro-cavities, and further including:
   locating a second curable layer on the first cured layer and the first cured material, imprinting the second curable layer, and curing the second curable layer to form a second cured layer imprinted with one or more second micro-cavities having width being less than or equal to 20 microns; and
   locating a different curable material in the second micro-cavities and curing the different curable material to form a different cured material in the second micro-cavities.

10. The method of claim 9, further including cross-linking the second curable layer to the first curable layer or cross-linking the second curable layer to the first curable material.

11. The method of claim 9, further including:
   providing a display having at least first and second pixels; and
   locating the display beneath the substrate with the first cured material in two or more of the first micro-cavities located at least partly above the first pixel and the first cured material in two or more different first micro-cavities located at least partly above the second pixel, and the different cured material located at least partly above a gap between two of the first micro-cavities.

12. The method of claim 9, wherein the different cured material is black.

13. The method of claim 9, further including exposing the curable material in the first cured layer and the curable material in the second cured layer from a direction opposite the substrate.

14. The method of claim 9, further including exposing the curable material in the first cured layer through the substrate and exposing the curable material in the second cured layer from a side of the first cured layer opposite the substrate.

15. The method of claim 1, wherein the cured layer is a first cured layer, the common cured material is a first cured material, and the micro-cavities are first micro-cavities, and further including:
   locating a second curable layer on the first cured layer and the first cured material, imprinting the second curable layer, and curing the second curable layer to form a second cured layer imprinted with one or more second micro-cavities having width being less than or equal to 20 microns; and
   locating a second curable material in the second micro-cavities and curing the second curable material to form a second cured material in the second micro-cavities; and
   wherein the first cured material has a first color and the second cured material has a second color different from the first color.

16. The method of claim 15, further including:
   locating a third curable layer on the second cured layer and the second cured material, imprinting the third curable layer, and curing the third curable layer to form a third cured layer imprinted with one or more third micro-cavities having width being less than or equal to 20 microns; and
   locating a third curable material in the third micro-cavities and curing the third curable material to form a third cured material in the third micro-cavities; and
   wherein the third cured material has a third color different from the first and second colors.

17. The method of claim 16, further including:
   locating a fourth curable layer on the third cured layer and the third cured material, imprinting the fourth curable layer, and curing the fourth curable layer to form a fourth cured layer imprinted with one or more fourth micro-cavities having width being less than or equal to 20 microns; and
   locating a fourth curable material in the fourth micro-cavities and curing the fourth curable material to form a fourth cured material in the fourth micro-cavities, wherein the fourth cured material is black.

18. The method of claim 17, wherein the display includes at least first, second, and third pixels located beneath the first cured layer and separated by gaps, the first pixel located at least partially beneath the first cured material, the second pixel located at least partially beneath the second cured material, the third pixel located at least partially beneath the third cured material, and the fourth cured material located at least partially above one or more gaps.

19. The method of claim 1, further including cross-linking the curable layer to the curable material.

* * * * *